US011984871B2

(12) United States Patent
Bywalez et al.

(10) Patent No.: US 11,984,871 B2
(45) Date of Patent: May 14, 2024

(54) PACKAGE COMPRISING STACKED FILTERS

(71) Applicant: RF360 SINGAPORE PTE. LTD., Singapore (SG)

(72) Inventors: Robert Felix Bywalez, Munich (DE); Ilya Lukashov, Munich (DE); Karl Albert Nicolaus, Zorneding (DE); Luis Maier, Munich (DE)

(73) Assignee: RF360 SINGAPORE PTE. LTD., Singapore (SG)

( * ) Notice: Subject to any disclaimer, the term of this patent is extended or adjusted under 35 U.S.C. 154(b) by 497 days.

(21) Appl. No.: 17/093,987

(22) Filed: Nov. 10, 2020

(65) Prior Publication Data

US 2021/0376816 A1 Dec. 2, 2021

Related U.S. Application Data

(60) Provisional application No. 63/032,317, filed on May 29, 2020.

(51) Int. Cl.
| | |
|---|---|
| *H03H 9/05* | (2006.01) |
| *H03H 3/02* | (2006.01) |
| *H03H 3/08* | (2006.01) |
| *H03H 9/10* | (2006.01) |
| *H03H 9/70* | (2006.01) |
| *H03H 9/72* | (2006.01) |

(52) U.S. Cl.
CPC ............ *H03H 9/0514* (2013.01); *H03H 3/02* (2013.01); *H03H 3/08* (2013.01); *H03H 9/059* (2013.01); *H03H 9/1042* (2013.01); *H03H 9/1085* (2013.01); *H03H 9/706* (2013.01); *H03H 9/725* (2013.01)

(58) Field of Classification Search
CPC ............ H03H 9/725; H03H 3/02; H03H 3/08; H03H 9/0514; H03H 9/059; H03H 9/1042; H03H 9/1085; H03H 9/706; H03H 9/0561; H03H 9/1007; H03H 9/1064
USPC .......................... 333/133, 187, 188, 193–196
See application file for complete search history.

(56) References Cited

U.S. PATENT DOCUMENTS

| | | | |
|---|---|---|---|
| 9,478,599 B1* | 10/2016 | Gubser .................... | H01L 23/50 |
| 9,634,641 B2* | 4/2017 | Nishimura ........... | H03H 9/0576 |
| 2012/0049978 A1* | 3/2012 | Pang ..................... | H03H 9/0547 |
| | | | 333/189 |
| 2017/0179920 A1* | 6/2017 | Kawasaki .............. | H03H 9/725 |
| 2020/0099365 A1* | 3/2020 | Choy ................... | H03H 9/1014 |

* cited by examiner

*Primary Examiner* — Rakesh B Patel
*Assistant Examiner* — Jorge L Salazar, Jr.
(74) *Attorney, Agent, or Firm* — Loza & Loza, LLP

(57) ABSTRACT

A package that includes a first filter device and a second filter device coupled to the first filter device. The first filter device includes a first substrate comprising a first piezoelectric material, and a first metal layer coupled to a first surface of the first substrate. The second filter device includes a second substrate comprising a second piezoelectric material, and a second metal layer coupled to a first surface of the first substrate. The package includes a first pillar interconnect configured to be electrically coupled to the first metal layer of the first filter device, where the first pillar interconnect extends through the second filter device. The package further includes a second pillar interconnect configured to be electrically coupled to the second metal layer of the second filter device.

20 Claims, 25 Drawing Sheets

*SIDE PROFILE VIEW*

*SIDE PROFILE VIEW*

FIG. 9 SIDE PROFILE VIEW

PLAN VIEW

SIDE PROFILE VIEW

PACKAGE COMPRISING STACKED FILTERS

CROSS-REFERENCE/CLAIM OF PRIORITY TO RELATED APPLICATION

The present application claims priority to and the benefit of U.S. Provisional Application No. 63/032,317, filed on May 29, 2020, and titled, "PACKAGE COMPRISING STACKED FILTERS", which is hereby expressly incorporated by reference.

FIELD

Various features relate to a filter implemented in an integrated device, but more specifically to a package that includes filters.

BACKGROUND

Radio frequency (RF) filters are components of a wireless device for filtering out unwanted signals. For example, a RF filter may be used to filter out signals at various frequencies, while letting through signals at a certain frequency. A wireless device may be configured to operate at different frequencies by including many RF filters, where each RF filter is configured to allow a certain signal with a certain frequency to pass through, thereby allowing the wireless device to operate and/or communicate at that frequency. However, RF filters take up a lot of space. A small wireless device has space constraints and may not be able to accommodate many RF filters, which limits the number of frequencies the small wireless device may operate and/or communicate at. There is an ongoing need to provide RF filters with better form factors and smaller sizes so that the RF filters may be implemented in smaller devices.

SUMMARY

Various features relate to a filter implemented in an integrated device, but more specifically to a package that includes filters.

One example provides a package that includes a first filter device and a second filter device coupled to the first filter device. The first filter device includes a first substrate comprising a first piezoelectric material, and a first metal layer coupled to a first surface of the first substrate. The second filter device includes a second substrate comprising a second piezoelectric material, and a second metal layer coupled to a first surface of the first substrate. The package includes a first pillar interconnect configured to be electrically coupled to the first metal layer of the first filter device, where the first pillar interconnect extends through the second filter device. The package further includes a second pillar interconnect configured to be electrically coupled to the second metal layer of the second filter device.

Another example provides an apparatus that includes means for first signal filtering, means for second signal filtering coupled to the means for first signal filtering, means for first pillar interconnection configured to be electrically coupled to the means for first signal filtering, where the means for first pillar interconnection extends through the means for second signal filtering, and means for second pillar interconnection configured to be electrically coupled to the means for second signal filtering.

Another example provides a method for fabricating a package. The method provides a first filter device that includes a first substrate comprising a first piezoelectric material, and a first metal layer coupled to a first surface of the first substrate. The method couples a second filter device to the first filter device. The second filter includes a second substrate comprising a second piezoelectric material and a second metal layer coupled to a first surface of the first substrate. The method forms a first pillar interconnect configured to be electrically coupled to the first metal layer of the first filter device, where the first pillar interconnect extends through the second filter device. The method forms a second pillar interconnect configured to be electrically coupled to the second metal layer of the second filter device.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a first filter device and a second filter device coupled to the first filter device. The first filter device includes a first substrate comprising a first piezoelectric material, and a first metal layer coupled to a first surface of the first substrate. The second filter device includes a second substrate comprising a second piezoelectric material, and a second metal layer coupled to a first surface of the first substrate. The package includes a first pillar interconnect configured to be electrically coupled to the first metal layer of the first filter device, where the first pillar interconnect extends through the second filter device. The package further includes a second pillar interconnect configured to be electrically coupled to the second metal layer of the second filter device. The filter devices may be signal filters (e.g., radio frequency (RF) filters). The first filter device and the second filter device may each be an integrated device. The configuration of the package provides a package with a more compact form factor and a smaller footprint, while providing multiple filters. For example, stacking the second filter device over the first filter device, or vice versa, reduces the laterally size of the package, while still providing a relatively thin package.

Exemplary Devices Configured as a Filter

Figure 1:
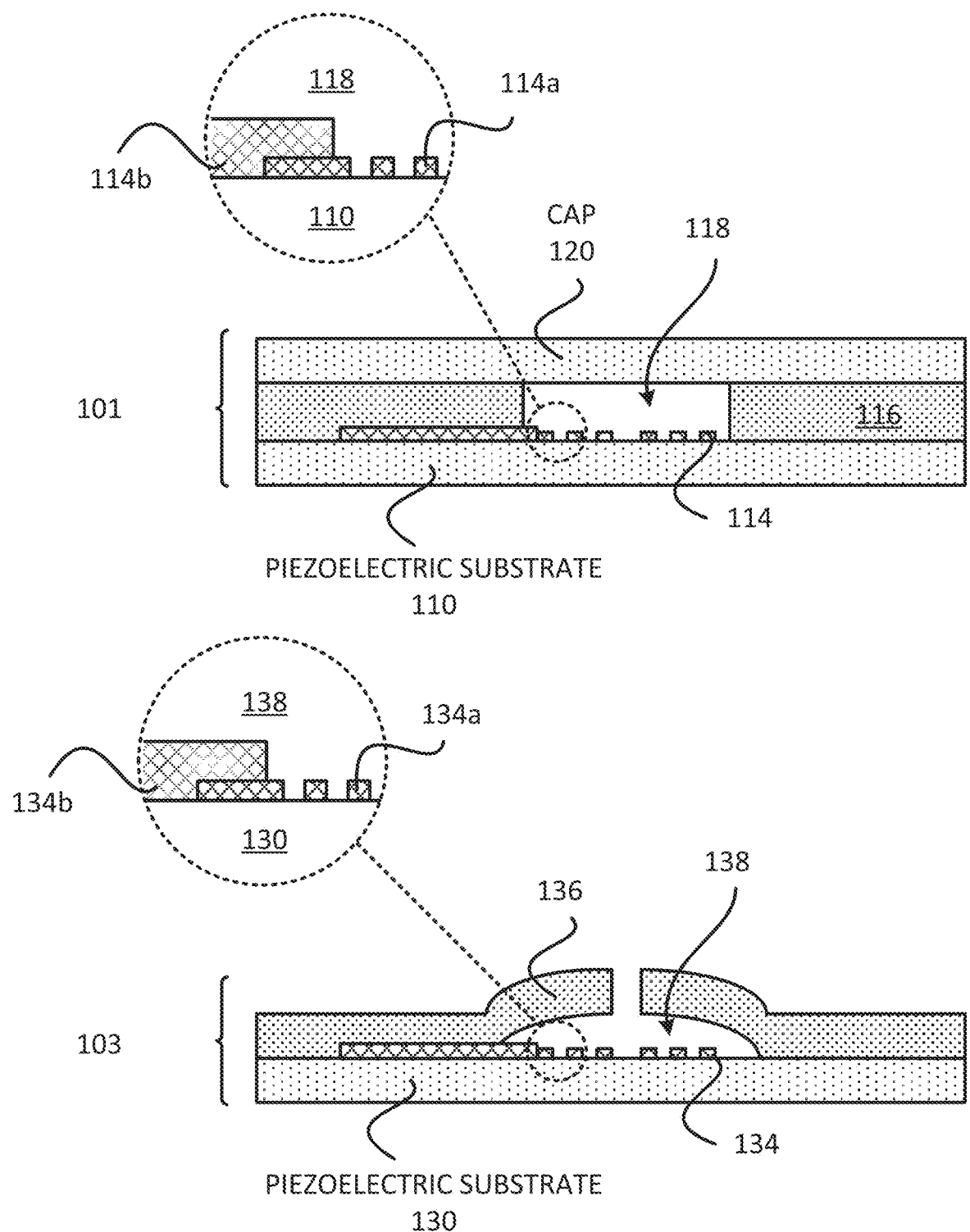
FIG. 1 illustrates two integrated devices, each configured to operate as a signal filter.

FIG. 1 illustrates a plan view of on a device 101 (e.g., integrated device, bare die) that is configured to operate as a filter, and a device 103 (e.g., integrated device, bare die) that is configured to operate as another filter. A filter device may be a signal filter device. A filter device may include a radio frequency (RF) filter. The device(s) (e.g., 101, 103) may be implemented in a radio frequency front end (RFFE) package. The device(s) (e.g., 101, 103) may be implemented as a device. The device(s) (e.g., 101, 103) may be implemented as a micro-electromechanical system (MEMS) device.

As shown in FIG. 1, the device 101 includes a substrate 110, a metal layer 114, an encapsulation layer 116, a void 118 and a substrate cap 120. The substrate 110 may be a piezoelectric substrate. For example, the substrate 110 may include a piezoelectric material (e.g., Aluminum Nitride (AlN), Lithium Niobate, Lithium Tantalate). In another example, the substrate 110 may include a piezoelectric layer that is formed and located over a surface of the substrate 110. For example, the substrate 110 may include glass with a piezoelectric material (e.g., piezoelectric layer) formed and located over a surface of the glass. Other materials may be used instead of glass for the substrate. Different implementations may use different materials for the piezoelectric material and/or the piezoelectric layer.

The metal layer 114 is formed over the substrate 110. In instances when the substrate 110 includes a piezoelectric layer formed and located over a surface of the substrate 110, the metal layer 114 may be formed and located over the piezoelectric layer. The metal layer 114 may include an electrically conductive material, such as copper (Cu). The metal layer 114 may be patterned and/or configured as interconnects, electrodes and/or transducers for the device 101. An example of how the metal layer 114 may be patterned and/or configured is illustrated and described below in at least FIG. 10. In some implementations, the metal layer 114 may include one or more metal layers. For example, the metal layer 114 may include a first metal layer 114a and a second metal layer 114b. The first metal layer 114a may be thinner than the second metal layer 114b. The first metal layer 114a may be configured to operate as at least one transducer, and the second metal layer 114b may be configured as at least one interconnect coupled to the transducer.

The encapsulation layer 116 is formed over the substrate 110. In instances when the substrate 110 includes a piezoelectric layer formed and located over a surface of the substrate 110, the encapsulation layer 116 may be formed and located over the piezoelectric layer. The encapsulation layer 116 may include a mold, a resin and/or an epoxy. The encapsulation layer 116 may be a means for encapsulation.

The substrate cap 120 is coupled to the encapsulation layer 116. The encapsulation layer 116 may be configured as a structural support layer for the substrate cap 120, allowing the substrate cap 120 to be placed and located over the substrate 110, the metal layer 114, while creating the void 118 between the substrate 110 and the substrate cap 120. A void may be a at least one region that is free of a solid material. A void may include a cavity. A void may be occupied by a gas (e.g., air). The substrate cap 120 may include different material. The substrate cap 120 may include the same material as the substrate 110.

It is noted that different implementations may use different materials for the various layers of a device. For example, instead of, or in conjunction with the encapsulation layer 116, the device 101 may include a sealing layer and/or a dielectric layer.

As further shown in FIG. 1, the device 103 includes a substrate 130, a metal layer 134, a dielectric layer 136 and a void 138. The substrate 130 may be a piezoelectric substrate. For example, the substrate 130 may include a piezoelectric material (e.g., Aluminum Nitride (AlN), quartz). In another example, the substrate 130 may include a piezoelectric material (e.g., piezoelectric layer) that is formed and located over a surface of the substrate 130. For example, the substrate 130 may include glass with a piezoelectric layer formed and located over a surface of the glass. Other materials may be used instead of glass for the substrate.

A piezoelectric substrate as used in the disclosure may mean a substrate that includes a piezoelectric material and/or a substrate that includes a piezoelectric material (e.g., piezoelectric layer) coupled to and located over a surface of the substrate. Different implementations may use different materials for the piezoelectric material and/or the piezoelectric layer. The substrate 130 may be the similar or the same as the substrate 110.

The metal layer 134 is formed over the substrate 130. In instances when the substrate 130 includes a piezoelectric layer formed and located over a surface of the substrate 130, the metal layer 134 may be formed and located over the piezoelectric layer. The metal layer 134 may include an electrically conductive material, such as copper (Cu). The metal layer 134 may be patterned and/or configured as interconnects, electrodes and/or transducers for the device 103. An example of how the metal layer 134 may be patterned and/or configured is illustrated and described below in at least FIG. 10. In some implementations, the metal layer 134 may include one or more metal layers. For example, the metal layer 134 may include a first metal layer 134a and a second metal layer 134b. The first metal layer 134a may be thinner than the second metal layer 134b. The first metal layer 134a may be configured to operate as at least one transducer, and the second metal layer 134b may be configured as at least one interconnect coupled to the transducer.

The dielectric layer 136 is formed over the substrate 130. In instances when the substrate 130 includes a piezoelectric layer formed and located over a surface of the substrate 130, the dielectric layer 136 may be formed and located over the piezoelectric layer. The dielectric layer 136 may include polyimide (PI). However, different implementations may use different materials for the dielectric layer 136.

The dielectric layer 136 is formed over the substrate 130 such that part of the dielectric layer 136 is configured as a cap for the device 103. The dielectric layer 136 may laterally surround portions of the metal layer 134 and be located over portions of the metal layer 134 such that a void 138 may be formed between the dielectric layer 136 and the substrate 130. The void 138 may have a dome shape (e.g., dome shaped void). A void may be a at least one region that is free of a solid material. A void may include a cavity. A void may be occupied by a gas (e.g., air). As will be further described below, a device may include a sealing layer located over and coupled to the dielectric layer 136. The sealing layer may include an organic layer.

Each of the device (e.g., 101. 103) (e.g., integrated circuit die) may be configured to operate as a surface acoustic wave (SAW) filter or a bulk acoustic wave (BAW) filter. Each device (e.g., 101. 103) may be configured to filter out signals at one or more frequencies and/or extract signals at one or more frequencies. The device (e.g., 101. 103) may be a means for signal filtering and/or means for signal extraction. Signal filtering may include signal extraction.

Figure 2:
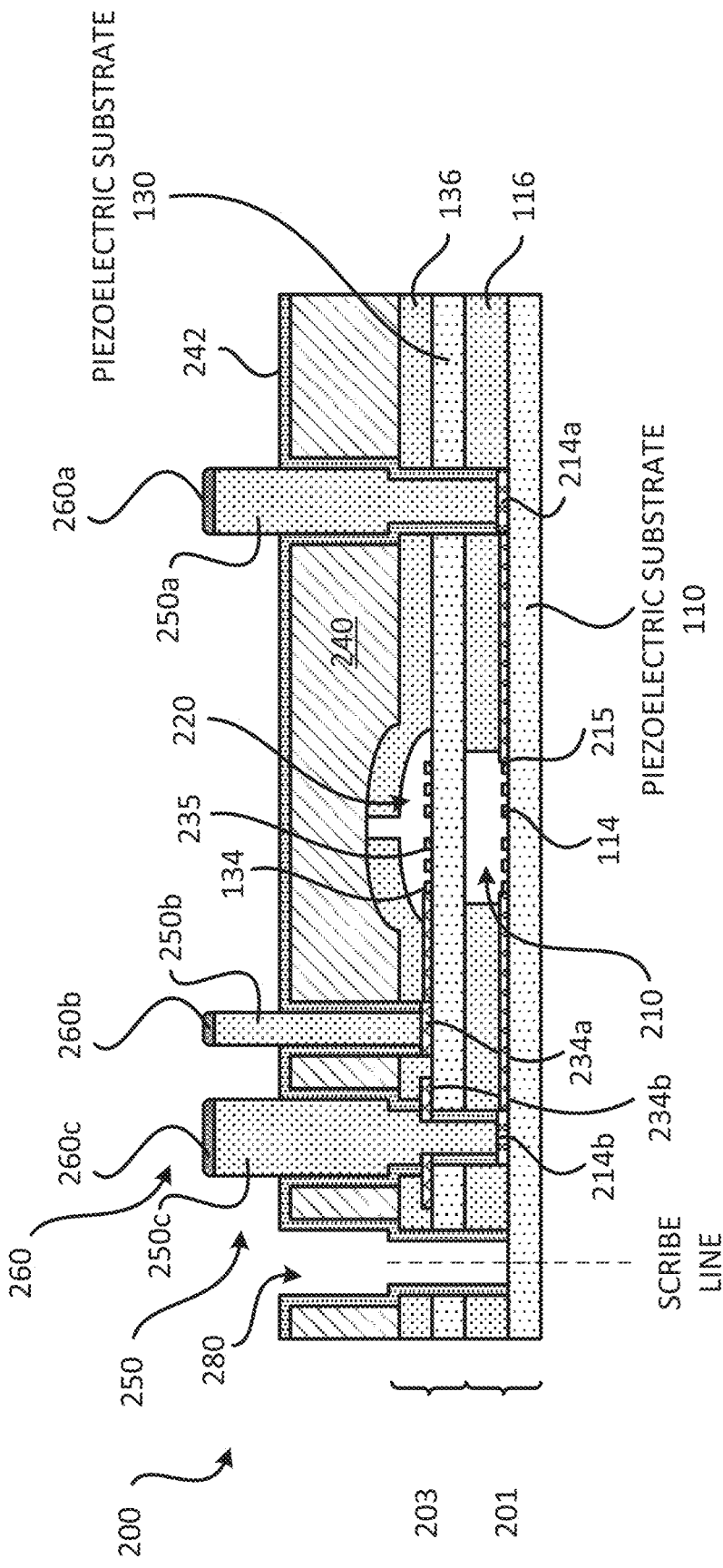
FIG. 2 illustrates a profile view of a package that includes multiple integrated devices configured as signal filters.

FIG. 2 illustrates a device 200 that includes stacked filter devices for signal filtering. The device 200 includes a filter device 201, a filter device 203 and a plurality of pillar interconnects 250. The device 200 may be a package (e.g., die package). The filter device 201 may be similar to the device 101, and thus may include similar or the same components as the device 101. The filter device 203 may be similar to the device 103, and thus may include similar or the same components as the device 103. The filter device 203 is coupled (e.g., mechanically coupled, structurally coupled) to the filter device 201. The filter device 203 may be vertically stacked over the filter device 201. In some implementations, the filter device 201 may be a first filter device, and the filter device 203 may be a second filter device. In some implementations, the filter device 203 may be a first filter device, and the filter device 201 may be a second filter device.

The filter device 201 includes the substrate 110, the metal layer 114, the encapsulation layer 116 and the void 210. The metal layer 114 is formed over and coupled to the substrate 110. The metal layer 114 may be patterned and/or configured to form at least one transducer 215 and at least interconnects 214a-214b. The encapsulation layer 116 is formed over and coupled to the substrate 110. The substrate 130 is located over and coupled to the encapsulation layer 116. The void 210 is located over a portion of the metal layer 114 that is configured to operate as at least one transducer 215 for the filter device 201. The void 210 may be surrounded by the substrate 110, the encapsulation layer 116 and the substrate 130. The substrate 130 may be configured as a cap for the filter device 201. The substrate 130 may be configured as a base for the filter device 203 and as a cap for the filter device 201. The filter device 201 includes a front side that faces the substrate 130. The front side of the filter device 201 may be a side that includes the at least one transducer 215.

The filter device 203 includes the substrate 130, the metal layer 134, the dielectric layer 136, a void 220, and a sealing layer 240. The metal layer 134 is formed over and coupled to the substrate 130. The metal layer 134 may be patterned and/or configured to form at least one transducer 235 and at least interconnects 234a-234b. The dielectric layer 136 is formed over and coupled to the substrate 130. The substrate 130 is located over and coupled to the encapsulation layer 116. The substrate 130 may be bonded to the encapsulation layer 116. The void 220 is located over a portion of the metal layer 134 that is configured to operate as at least one transducer 235 for the filter device 203. The void 220 may be surrounded by the substrate 130, the dielectric layer 136 and the sealing layer 240. The dielectric layer 136 is located over the substrate 130 such that part of the dielectric layer 136 is configured as a cap for the filter device 203. The dielectric layer 136 may be located laterally and over portions of the metal layer 134 that is configured to operate as at least one transducer 235 for the filter device 203 such that the void 220 may be formed between the dielectric layer 136 and the substrate 130. The void 220 may include a dome shape. The sealing layer 240 is located over and coupled to the dielectric layer 136. There may be an opening in the dielectric layer 136 over a portion of the metal layer 134 that is configured to operate as at least one transducer 235. The filter device 203 includes a front side that faces away from the filter device 201. The front side of the filter device 203 may be a side that includes the at least one transducer 235.

As mentioned above, the device 200 includes a plurality of pillar interconnects 250, where at least one pillar interconnect is configured to be electrically coupled to the filter device 201 and at least one pillar interconnect is configured to be electrically coupled to the filter device 203. The device 200 may include a passivation layer 242 that is formed over and/or coupled to various surfaces, cavities, and components.

The device 200 includes a pillar interconnect 250a (e.g., first pillar interconnect, means for first pillar interconnection) that extends through the filter device 203 and is configured to be electrically coupled to the filter device 201. In particular, the pillar interconnect 250a extends through the sealing layer 240, the dielectric layer 136, the substrate 130 and the encapsulation layer 116. The pillar interconnect 250a may be coupled to the interconnect 214a (of the metal layer 114). The pillar interconnect 250a may be configured to be electrically coupled to the at least one transducer 215 through at least the interconnect 214a. The pillar interconnect 250a may be laterally surrounded by the passivation layer 242.

The device 200 includes a pillar interconnect 250b (e.g., second pillar interconnect, means for second pillar interconnection) that is configured to be coupled to the filter device 203. The pillar interconnect 250b may extend through the sealing layer 240 and the dielectric layer 136. The pillar interconnect 250b may be coupled to the interconnect 234a (of the metal layer 134). The pillar interconnect 250b may be configured to be electrically coupled to the at least one transducer 235 through at least the interconnect 234a.

The device 200 includes a pillar interconnect 250c (e.g., third pillar interconnect, means for third pillar interconnection) that extends through the filter device 203 and may be configured to be electrically coupled to the filter device 201 and the filter device 203. In particular, the pillar interconnect 250a extends through the sealing layer 240, the dielectric layer 136, the substrate 130 and the encapsulation layer 116. The pillar interconnect 250c may be coupled to the interconnect 214b (of the metal layer 114) and the interconnect 234b (of the metal layer 134). The pillar interconnect 250c may be configured to be electrically coupled to ground, the filter device 201 and the filter device 203. The pillar interconnect 250c may be laterally surrounded by the passivation layer 242.

It is noted that the plurality of pillar interconnects 250 may have uniform width or variable width (e.g., variable step width) as it extends through various layers of the filter device 203 and the filter device 201. Variable step width for a pillar interconnect may mean that as a pillar interconnect extends through a new layer or material, the width of the pillar interconnect may change (e.g., increase in width, decrease in width). For example, as the pillar interconnect 250a extends from the sealing layer 240 to the dielectric layer 136, the width of the pillar interconnect 250a is reduced. In another example, as the pillar interconnect 250c extends from the sealing layer 240 to the dielectric layer 136, the width of the pillar interconnect 250c is reduced, and as the pillar interconnect 250c extends from the dielectric layer 136 to the substrate 130, the width of the pillar interconnect 250c is further reduced.

A plurality of solder interconnects 260 is coupled to the plurality of pillar interconnects 250. For example, the solder interconnect 260a is coupled to the pillar interconnect 250a, the solder interconnect 260b is coupled to the pillar interconnect 250b and the solder interconnect 260c is coupled to the pillar interconnect 250c.

It is noted that the device 200 may include a different number of pillar interconnects 250 that are coupled to the filter device 201 and/or the filter device 203. Thus, the device 200 is not limited to three pillar interconnects 250. Any of the devices that includes in filter devices that are described in the disclosure may include more than 3 pillar interconnects. FIG. 2 illustrates a cavity 280. The cavity 280 may be located where the device 200 may be cut. This may be the case, when several devices are fabricated as part of a wafer, and the devices are cut into individual devices through a singulation a process that may involve a mechanical cut through the cavity 280.

In some implementations, the filter device 201 may be a means for first signal filtering and the filter device 203 may be a means for second signal filtering. In some implementations, the filter device 203 may be a means for first signal filtering and the filter device 201 may be a means for second signal filtering. The device 200 may be implemented in a radio frequency front end (RFFE) package. The stacking (e.g., vertical stacking) of the filter device 201 and the filter device 203 allows for a device with a more compact form factor and a reduced footprint. The filter device 201 and/or the filter device 203 may be configured to operate as a surface acoustic wave (SAW) filter or a bulk acoustic wave (BAW) filter. The filter device 201 and/or the filter device 203 may each be implemented as an integrated device (e.g., bare die). The filter device 201 may be configured to extract a first signal with a first frequency (while filtering out one or more other frequencies), while the filter device 203 may be configured to extract a second signal with a second frequency (while filtering out one or more other frequencies). When the filter device 201 and the filter device 203 are implemented with a wireless device (e.g., device with wireless capabilities), the wireless device may be able to operate and/or communicate at the first frequency and/or the second frequency.

FIG. 2 illustrates one configuration of vertically stacked filters. The device 200 provides a small footprint, while also providing low thickness since a redistribution portion does not need to be formed above the sealing layer 240 and the passivation layer 242. The device 200 provides a front to back configuration where a filter device with a dome shape void is located over a filter device with a non-dome shape void. The filter device 203 may be a front side filter device and the filter device 201 may be a back side filter device. The overall thickness of the device 200 may be in a range of approximately 160 micrometers to 200 micrometers (≈160-200 micrometers). Similar thicknesses may be applicable to other devices described in the present disclosure.

Figure 3:
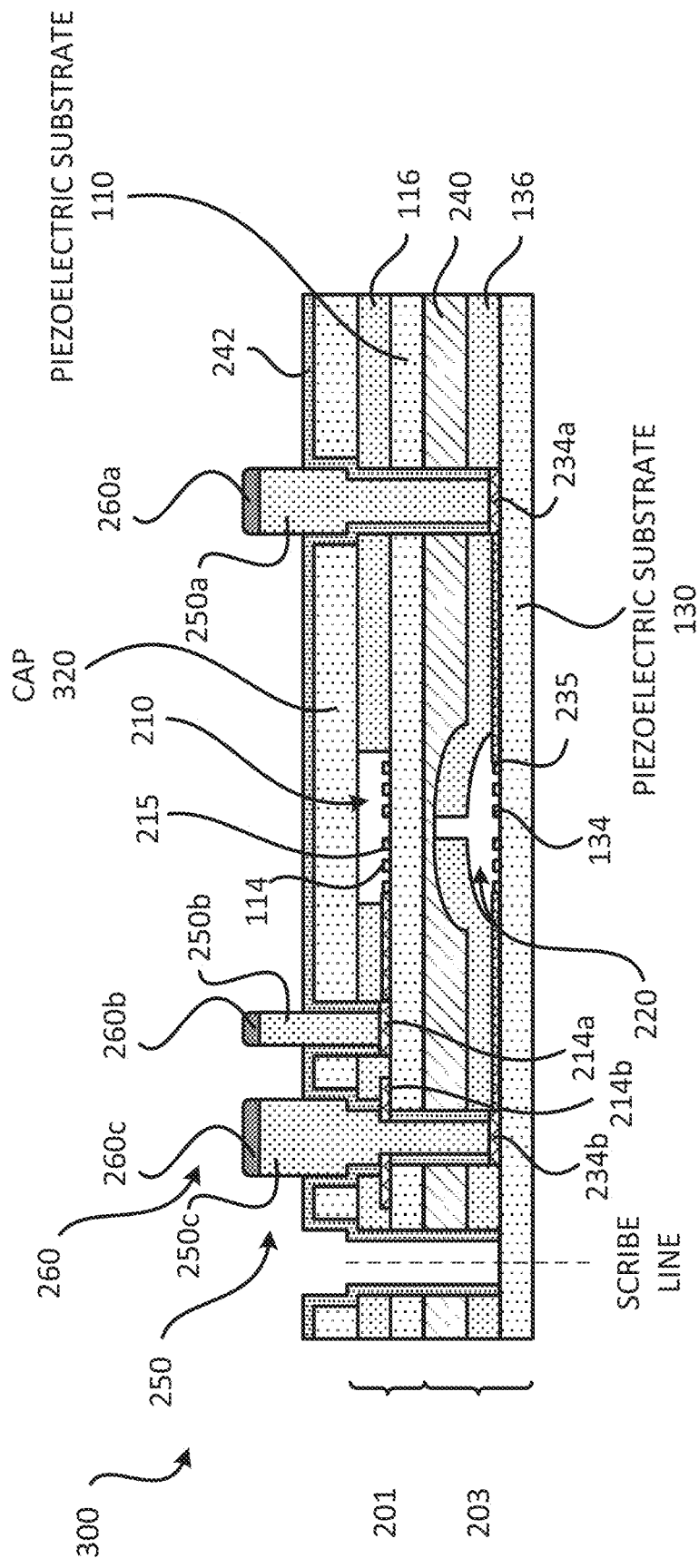
FIG. 3 illustrates a profile view of another package that includes multiple integrated devices configured as signal filters.
Figure 4:
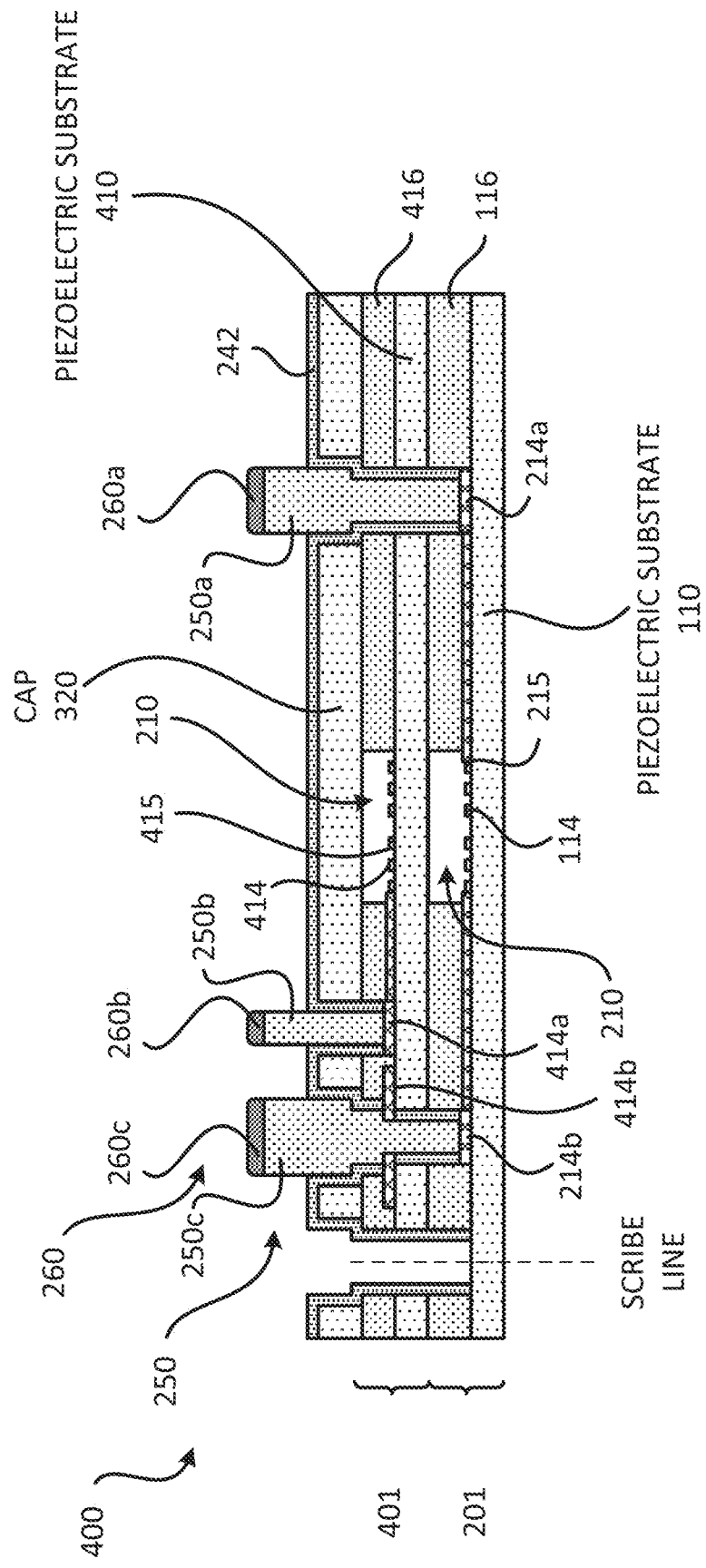
FIG. 4 illustrates a profile view of another package that includes multiple integrated devices configured as signal filters.
Figure 5:
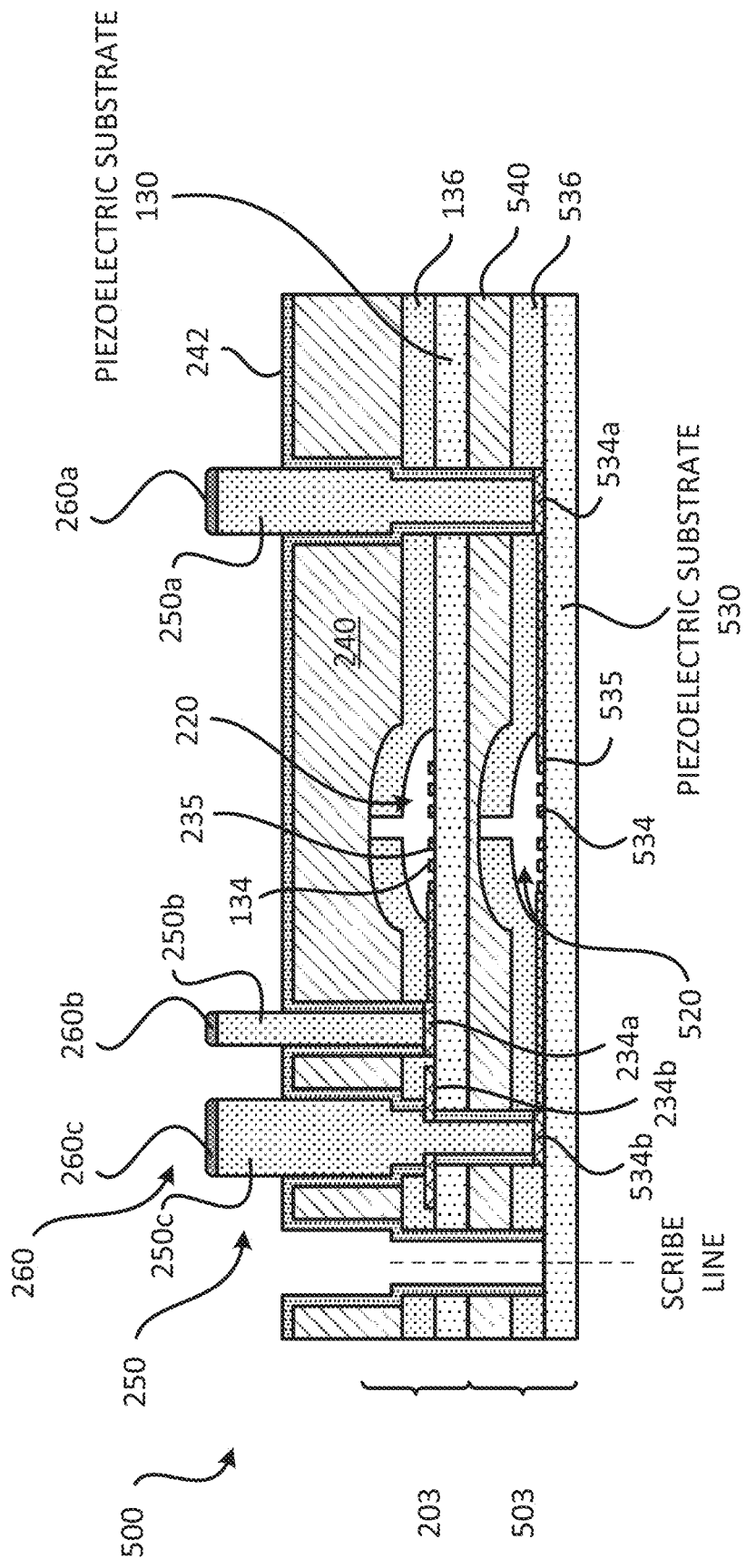
FIG. 5 illustrates a profile view of another package that includes multiple integrated devices configured as signal filters.

FIGS. 3-5 illustrate other examples of devices with a front to back configuration. FIG. 3 illustrates a device 300 that includes the filter device 201 and the filter device 203. The device 300 is similar to the device 200, and includes similar or the same components as the device 200. However, the device 300 is configured in such a way that the filter device 201 may be a front side filter device and the filter device 203 may be a back side filter device. The filter device 201 is located over and coupled (e.g., mechanically coupled, structurally coupled) to the filter device 203. The device 300 provides a front to back configuration where a filter device with a non-dome shape void is located over a filter device with a dome shape void.

The filter device 201 is coupled to the filter device 203 such that the substrate 110 is coupled to the sealing layer 240. The filter device 201 includes a cap 320 which is coupled to the encapsulation layer 116. The cap 320 may be a substrate. The cap 320 may include the same material as the substrate 110.

The device 300 includes the plurality of pillar interconnects 250. The plurality of pillar interconnects 250 for the device 300 may be configured in a similar way as described for the device 200. However, the plurality of pillar interconnects 250 may extend through different layers and/or materials.

The device 300 includes a pillar interconnect 250a (e.g., first pillar interconnect) that extends through the filter device 201 and is configured to be electrically coupled to the filter device 203. In particular, the pillar interconnect 250a extends through the cap 320, the encapsulation layer 116, the substrate 110, the sealing layer 240 and the dielectric layer 136. The pillar interconnect 250a may be coupled to the interconnect 234a (of the metal layer 134). The pillar interconnect 250a may be configured to be electrically coupled to the at least one transducer 235 through at least the interconnect 234a. The pillar interconnect 250a may be laterally surrounded by the passivation layer 242.

The device 300 includes a pillar interconnect 250b (e.g., second pillar interconnect) that is configured to be coupled to the filter device 201. The pillar interconnect 250b may extend through the cap 320 and the encapsulation layer 116. The pillar interconnect 250b may be coupled to the interconnect 214a (of the metal layer 114). The pillar interconnect 250b may be configured to be electrically coupled to the at least one transducer 215 through at least the interconnect 214a.

The device 300 includes a pillar interconnect 250c (e.g., third pillar interconnect) that extends through the filter device 201 and is configured to be electrically coupled to the filter device 201 and the filter device 203. In particular, the pillar interconnect 250c extends through the cap 320, the encapsulation layer 116, the substrate 110, the sealing layer 240 and the dielectric layer 136. The pillar interconnect 250*c* may be coupled to the interconnect 214*b* (of the metal layer 114) and the interconnect 234*b* (of the metal layer 134). The pillar interconnect 250*c* may be configured to be electrically coupled to ground, the filter device 201 and the filter device 203. The pillar interconnect 250*c* may be laterally surrounded by the passivation layer 242.

FIG. 4 illustrates a device 400 that includes the filter device 201 and the filter device 401. The filter device 401 is similar to the filter device 201, and includes similar or the same components as the filter device 201. The filter device 401 is located over and coupled (e.g., mechanically coupled, structurally coupled) to the filter device 201. The filter device 401 includes the substrate 410, the metal layer 414, the encapsulation layer 416, the void 210 and the cap 320. The metal layer 414 is formed over and coupled to the substrate 410. The metal layer 414 may be patterned and/or configured to form at least one transducer 415 and at least interconnects 414*a*-414*b*. The encapsulation layer 416 is located over and coupled to the substrate 410. The substrate 410 is located over and coupled to the encapsulation layer 116. The void 210 is located over a portion of the metal layer 414 that is configured to operate as at least one transducer 415 for the filter device 401.

The device 400 includes the plurality of pillar interconnects 250. The plurality of pillar interconnects 250 for the device 400 may be configured in a similar way as described for the device 200. However, the plurality of pillar interconnects 250 may extend through different layers and/or materials.

The device 400 includes a pillar interconnect 250*a* (e.g., first pillar interconnect) that extends through the filter device 401 and is configured to be electrically coupled to the filter device 201. In particular, the pillar interconnect 250*a* extends through the cap 320, the encapsulation layer 416, the substrate 410 and the encapsulation layer 116. The pillar interconnect 250*a* may be coupled to the interconnect 214*a* (of the metal layer 114). The pillar interconnect 250*a* may be configured to be electrically coupled to the at least one transducer 215 through at least the interconnect 214*a*. The pillar interconnect 250*a* may be laterally surrounded by the passivation layer 242.

The device 400 includes a pillar interconnect 250*b* (e.g., second pillar interconnect) that is configured to be coupled to the filter device 401. The pillar interconnect 250*b* may extend through the cap 320 and the encapsulation layer 116. The pillar interconnect 250*b* may be coupled to the interconnect 414*a* (of the metal layer 414). The pillar interconnect 250*b* may be configured to be electrically coupled to the at least one transducer 415 through at least the interconnect 414*a*.

The device 400 includes a pillar interconnect 250*c* (e.g., third pillar interconnect) that extends through the filter device 401 and is configured to be electrically coupled to the filter device 201 and the filter device 401. In particular, the pillar interconnect 250*a* extends through the cap 320, the encapsulation layer 116, the substrate 410 and the encapsulation layer 116. The pillar interconnect 250*c* may be coupled to the interconnect 214*b* (of the metal layer 114) and the interconnect 414*b* (of the metal layer 414). The pillar interconnect 250*c* may be configured to be electrically coupled to ground, the filter device 201 and the filter device 401. The pillar interconnect 250*c* may be laterally surrounded by the passivation layer 242.

FIG. 5 illustrates a device 500 that includes the filter device 203 and the filter device 503. The filter device 503 is similar to the filter device 203, and includes similar or the same components as the filter device 203. The filter device 203 is located over and coupled (e.g., mechanically coupled, structurally coupled) to the filter device 503. The filter device 503 includes the substrate 530, the metal layer 534, the dielectric layer 536, the void 520 and the sealing layer 540. The metal layer 534 is formed over and coupled to the substrate 530. The metal layer 534 may be patterned and/or configured to form at least one transducer 535 and at least interconnects 534*a*-534*b*. The dielectric layer 536 is formed over and coupled to the substrate 530. The dielectric layer 536 may located over the metal layer 534 such as to create a void 520. The void 520 may include a dome shape. The void 210 is located over a portion of the metal layer 534 that is configured to operate as at least one transducer 535 for the filter device 503. The sealing layer 540 may be formed over and coupled to the dielectric layer 536. The filter device 203 may be coupled to the filter device 503 such that the substrate 130 is located over and coupled to the sealing layer 540.

The device 500 includes the plurality of pillar interconnects 250. The plurality of pillar interconnects 250 for the device 500 may be configured in a similar way as described for the device 200. However, the plurality of pillar interconnects 250 may extend through different layers and/or materials.

The device 500 includes a pillar interconnect 250*a* (e.g., first pillar interconnect) that extends through the filter device 203 and is configured to be electrically coupled to the filter device 503. In particular, the pillar interconnect 250*a* extends through the sealing layer 240, the dielectric layer 136, the substrate 130, the sealing layer 540 and the dielectric layer 536. The pillar interconnect 250*a* may be coupled to the interconnect 534*a* (of the metal layer 134). The pillar interconnect 250*a* may be configured to be electrically coupled to the at least one transducer 535 through at least the interconnect 534*a*. The pillar interconnect 250*a* may be laterally surrounded by the passivation layer 242.

The device 500 includes a pillar interconnect 250*b* (e.g., second pillar interconnect) that is configured to be coupled to the filter device 203. The pillar interconnect 250*b* may extend through the sealing layer 240 and the dielectric layer 136. The pillar interconnect 250*b* may be coupled to the interconnect 234*a* (of the metal layer 134). The pillar interconnect 250*b* may be configured to be electrically coupled to the at least one transducer 235 through at least the interconnect 234*a*.

The device 500 includes a pillar interconnect 250*c* (e.g., third pillar interconnect) that extends through the filter device 203 and is configured to be electrically coupled to the filter device 203 and the filter device 503. In particular, the pillar interconnect 250*a* extends through the sealing layer 240, the dielectric layer 136, the substrate 130, the sealing layer 540 and the dielectric layer 536. The pillar interconnect 250*c* may be coupled to the interconnect 234*b* (of the metal layer 134) and the interconnect 534*b* (of the metal layer 534). The pillar interconnect 250*c* may be configured to be electrically coupled to ground, the filter device 203 and the filter device 503. The pillar interconnect 250*c* may be laterally surrounded by the passivation layer 242.

Figure 6:
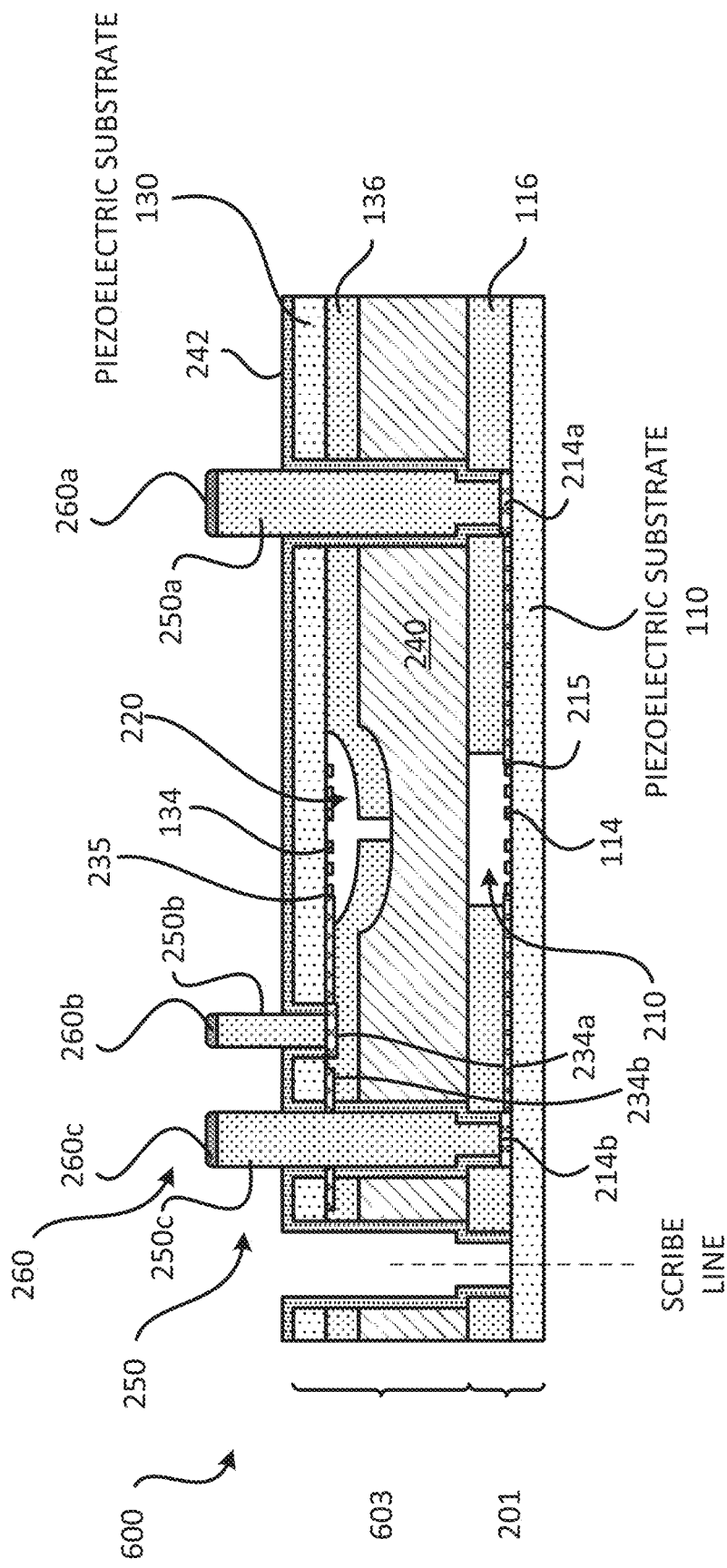
FIG. 6 illustrates a profile view of another package that includes multiple integrated devices configured as signal filters.

FIGS. 6-9 illustrate examples of devices with a face to face configuration (e.g., front to front configuration). FIG. 6 illustrates a device 600 that includes the filter device 201 and the filter device 603. The device 600 is similar to the device 200, and includes similar or the same components as the device 200. However, the device 600 is configured in such a way that the filter device 603 is coupled (e.g., mechanically coupled, structurally coupled) to the filter device 201 such that the front side of the filter device 603 faces a front side of the filter device 201. The filter device 603 is similar to the filter device 203, and thus includes similar or the same components as the filter device 203. The filter device 603 includes the substrate 130, the metal layer 134, the dielectric layer 136, the void 220 and the sealing layer 240. The filter device 603 is coupled to the filter device 201 such that the sealing layer 240 is located over and coupled to the encapsulation layer 116. The sealing layer 240 may be configured as a cap for the transducer 215 of the filter device 201.

The device 600 includes the plurality of pillar interconnects 250. The plurality of pillar interconnects 250 for the device 600 may be configured in a similar way as described for the device 200. However, the plurality of pillar interconnects 250 may extend through different layers and/or materials.

The device 600 includes a pillar interconnect 250a (e.g., first pillar interconnect) that extends through the filter device 603 and is configured to be electrically coupled to the filter device 201. In particular, the pillar interconnect 250a may extend through the substrate 130, the dielectric layer 136, the sealing layer 240 and the encapsulation layer 116. The pillar interconnect 250a may be coupled to the interconnect 214a (of the metal layer 114). The pillar interconnect 250a may be configured to be electrically coupled to the at least one transducer 215 through at least the interconnect 214a. The pillar interconnect 250a may be laterally surrounded by the passivation layer 242.

The device 600 includes a pillar interconnect 250b (e.g., second pillar interconnect) that is configured to be coupled to the filter device 603. The pillar interconnect 250b may extend through the substrate 130. The pillar interconnect 250b may be coupled to the interconnect 234a (of the metal layer 134). The pillar interconnect 250b may be configured to be electrically coupled to the at least one transducer 235 through at least the interconnect 234a.

The device 600 includes a pillar interconnect 250c (e.g., third pillar interconnect) that extends through the filter device 603 and is configured to be electrically coupled to the filter device 201 and the filter device 603. In particular, the pillar interconnect 250c extends through the substrate 130, the dielectric layer 136, the sealing layer 240 and the encapsulation layer 116. The pillar interconnect 250c may be coupled to the interconnect 214b (of the metal layer 114) and the interconnect 234b (of the metal layer 134). The pillar interconnect 250c may be configured to be electrically coupled to ground, the filter device 201 and the filter device 603. The pillar interconnect 250c may be laterally surrounded by the passivation layer 242.

Figure 7:
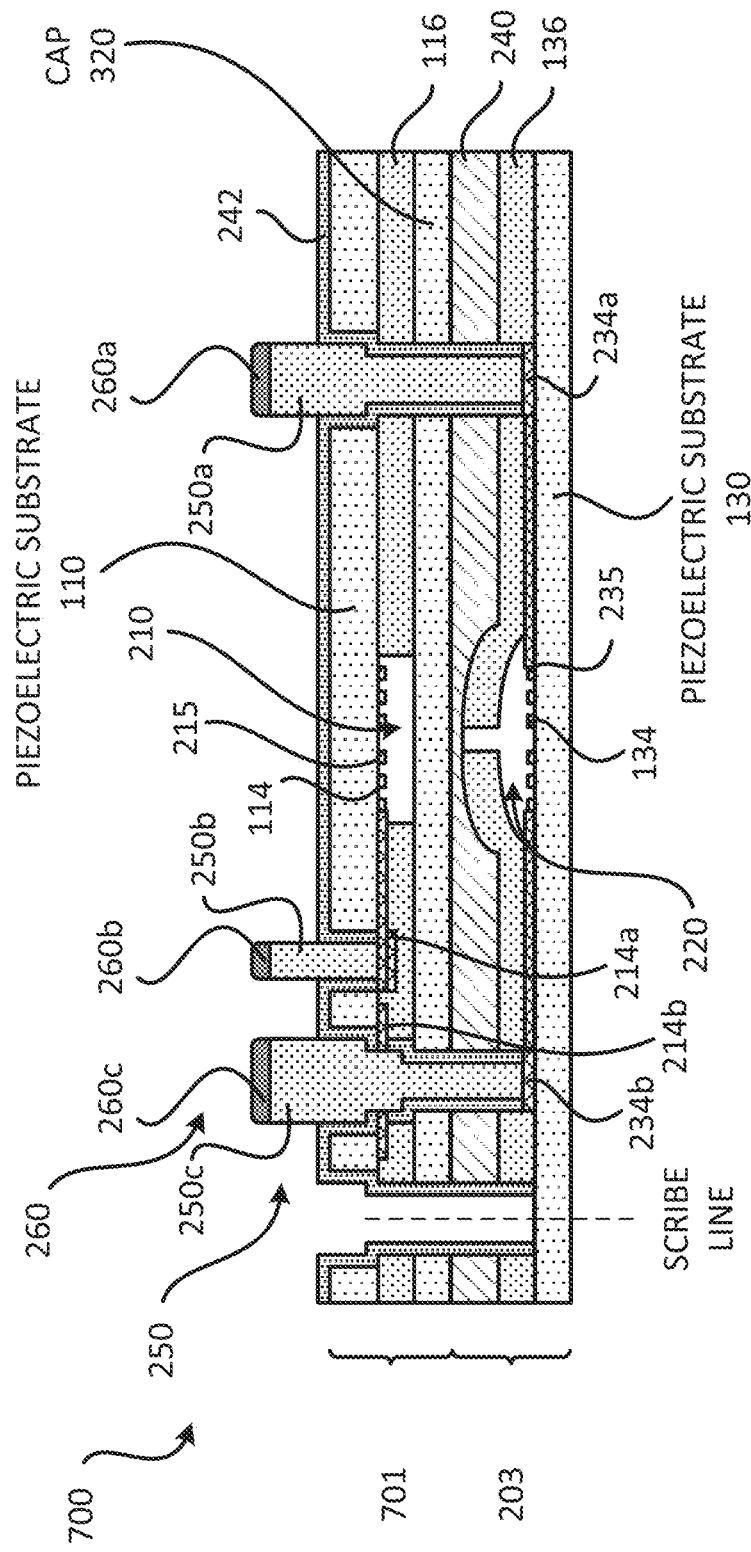
FIG. 7 illustrates a profile view of another package that includes multiple integrated devices configured as signal filters.

FIG. 7 illustrates a device 700 that includes the filter device 701 and the filter device 203. The device 700 is similar to the device 300, and includes similar or the same components as the device 300. However, the device 700 is configured in such a way that the filter device 701 is coupled (e.g., mechanically coupled, structurally coupled) to the filter device 203 such that the front side of the filter device 701 faces a front side of the filter device 203. The filter device 701 is similar to the filter device 201, and thus includes similar or the same components as the filter device 201. The filter device 701 includes the substrate 110, the metal layer 114, the encapsulation layer 116, the void 210 and the cap 320. The filter device 701 is coupled to the filter device 203 such that the cap 320 is located over and coupled to the sealing layer 240.

The device 700 includes the plurality of pillar interconnects 250. The plurality of pillar interconnects 250 for the device 700 may be configured in a similar way as described for the device 200. However, the plurality of pillar interconnects 250 may extend through different layers and/or materials.

The device 700 includes a pillar interconnect 250a (e.g., first pillar interconnect) that extends through the filter device 701 and is configured to be electrically coupled to the filter device 203. In particular, the pillar interconnect 250a extends through the substrate 130, the encapsulation layer 116, the sealing layer 240 and the dielectric layer 136. The pillar interconnect 250a may be coupled to the interconnect 234a (of the metal layer 134). The pillar interconnect 250a may be configured to be electrically coupled to the at least one transducer 235 through at least the interconnect 234a. The pillar interconnect 250a may be laterally surrounded by the passivation layer 242.

The device 700 includes a pillar interconnect 250b (e.g., second pillar interconnect) that is configured to be coupled to the filter device 701. The pillar interconnect 250b may extend through the substrate 110. The pillar interconnect 250b may be coupled to the interconnect 214a (of the metal layer 114). The pillar interconnect 250b may be configured to be electrically coupled to the at least one transducer 215 through at least the interconnect 214a.

The device 700 includes a pillar interconnect 250c (e.g., third pillar interconnect) that extends through the filter device 701 and is configured to be electrically coupled to the filter device 701 and the filter device 203. In particular, the pillar interconnect 250c extends through the substrate 130, the encapsulation layer 116, the sealing layer 240 and the dielectric layer 136. The pillar interconnect 250c may be coupled to the interconnect 214b (of the metal layer 114) and the interconnect 234b (of the metal layer 134). The pillar interconnect 250c may be configured to be electrically coupled to ground, the filter device 701 and the filter device 203. The pillar interconnect 250c may be laterally surrounded by the passivation layer 242.

Figure 8:
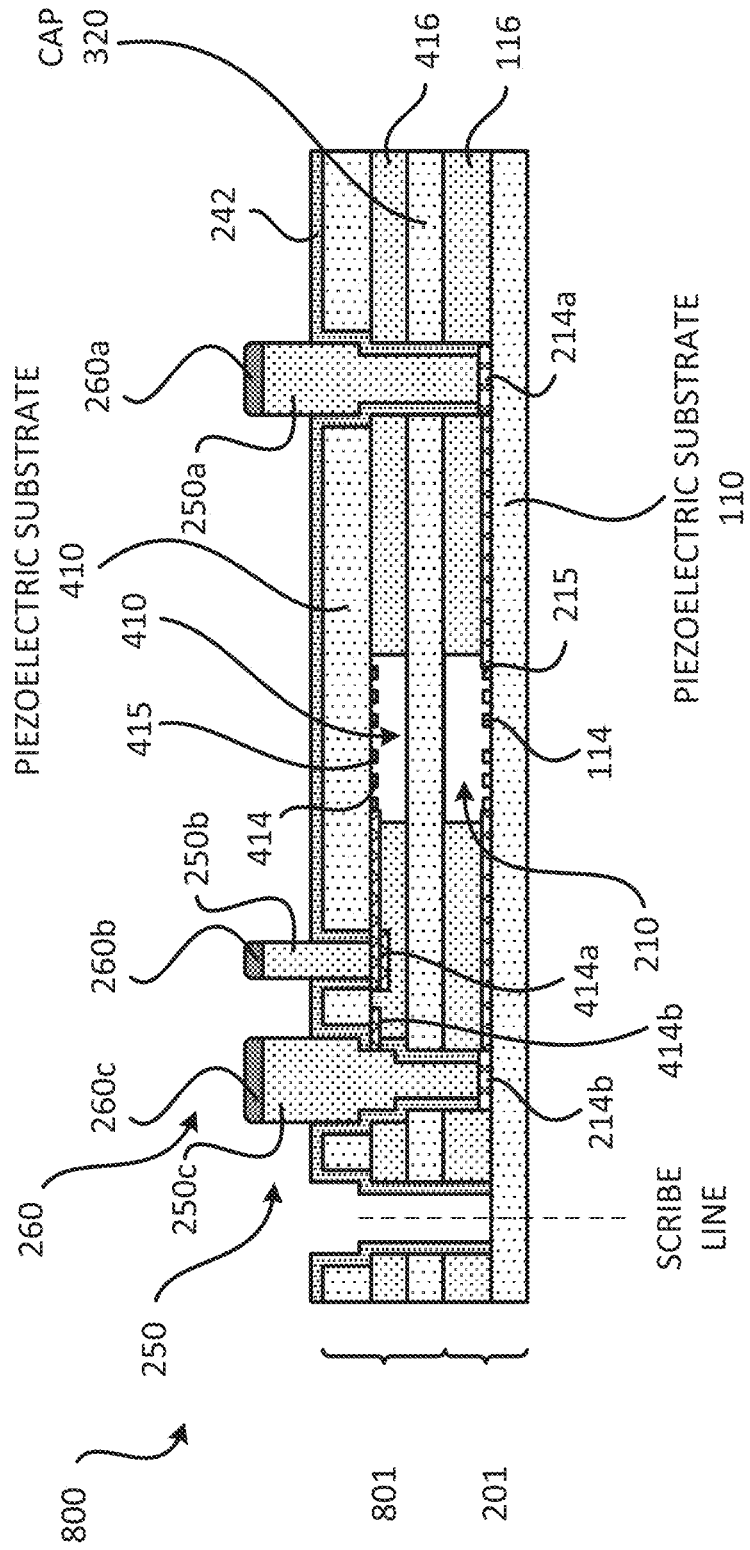
FIG. 8 illustrates a profile view of another package that includes multiple integrated devices configured as signal filters.

FIG. 8 illustrates a device 800 that includes the filter device 801 and the filter device 201. The device 800 is similar to the device 400, and includes similar or the same components as the device 400. However, the device 800 is configured in such a way that the filter device 801 is coupled (e.g., mechanically coupled, structurally coupled) to the filter device 201 such that the front side of the filter device 801 faces a front side of the filter device 201. The filter device 801 is similar to the filter device 401, and thus includes similar or the same components as the filter device 401. The filter device 801 includes the substrate 410, the metal layer 414, the encapsulation layer 416, the void 210 and the cap 320. The filter device 801 is coupled to the filter device 201 such that the cap 320 is located over and coupled to the encapsulation layer 116.

The device 800 includes the plurality of pillar interconnects 250. The plurality of pillar interconnects 250 for the device 800 may be configured in a similar way as described for the device 200. However, the plurality of pillar interconnects 250 may extend through different layers and/or materials.

The device 800 includes a pillar interconnect 250a (e.g., first pillar interconnect) that extends through the filter device 801 and is configured to be electrically coupled to the filter device 201. In particular, the pillar interconnect 250a extends through the substrate 410, the encapsulation layer 416, the cap 320 and the encapsulation layer 116. The pillar interconnect 250a may be coupled to the interconnect 214a (of the metal layer 114). The pillar interconnect 250a may be configured to be electrically coupled to the at least one transducer 215 through at least the interconnect 214a. The pillar interconnect 250a may be laterally surrounded by the passivation layer 242.

The device 800 includes a pillar interconnect 250b (e.g., second pillar interconnect) that is configured to be coupled to the filter device 801. The pillar interconnect 250b may extend through the substrate 410. The pillar interconnect 250b may be coupled to the interconnect 414a (of the metal layer 414). The pillar interconnect 250b may be configured to be electrically coupled to the at least one transducer 415 through at least the interconnect 414a.

The device 800 includes a pillar interconnect 250c (e.g., third pillar interconnect) that extends through the filter device 801 and is configured to be electrically coupled to the filter device 201 and the filter device 801. In particular, the pillar interconnect 250a extends through the substrate 410, the encapsulation layer 416, the cap 320 and the encapsulation layer 116. The pillar interconnect 250c may be coupled to the interconnect 214b (of the metal layer 114) and the interconnect 414b (of the metal layer 414). The pillar interconnect 250c may be configured to be electrically coupled to ground, the filter device 201 and the filter device 801. The pillar interconnect 250c may be laterally surrounded by the passivation layer 242.

Figure 9:
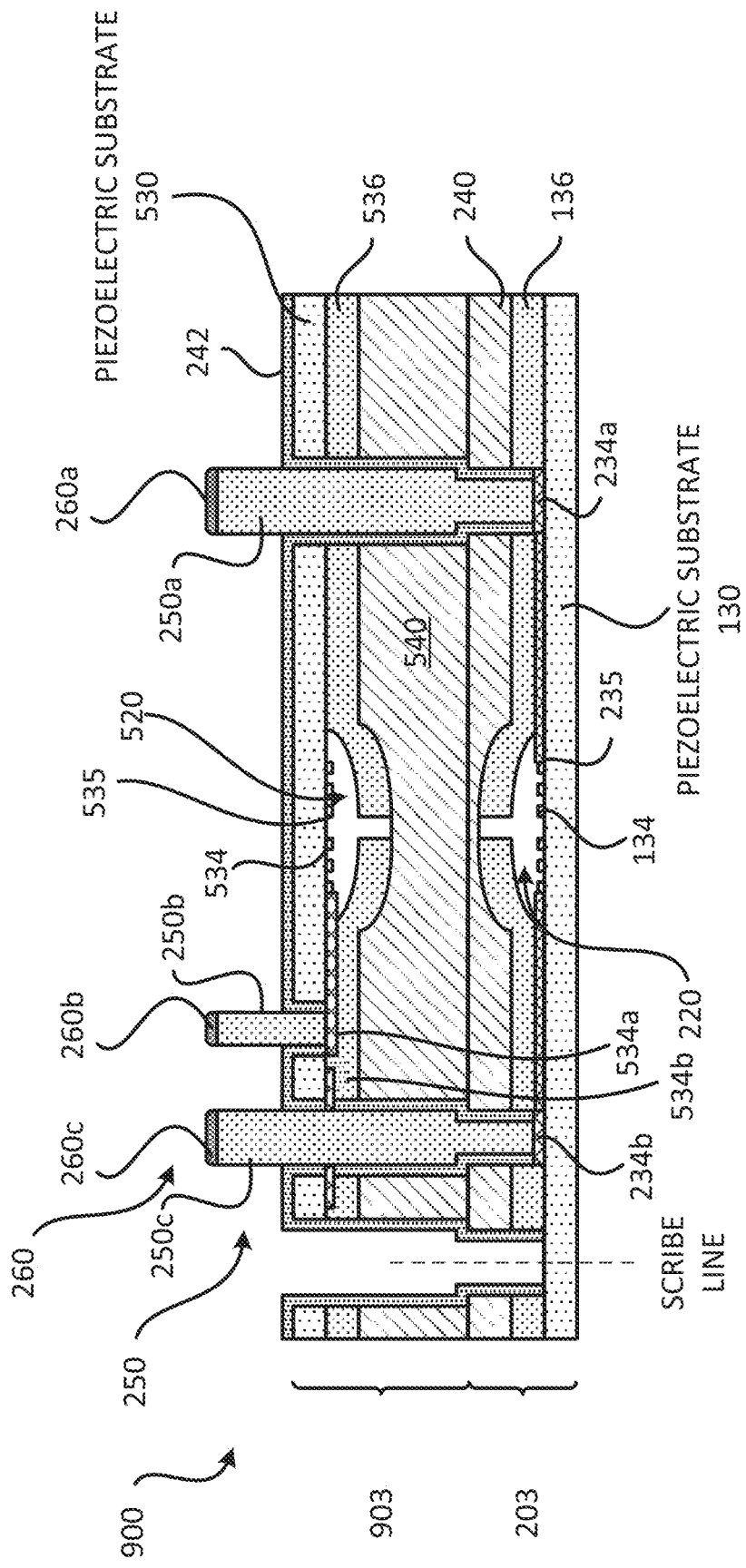
FIG. 9 illustrates a profile view of another package that includes multiple integrated devices configured as signal filters.

FIG. 9 illustrates a device 900 that includes the filter device 903 and the filter device 203. The device 900 is similar to the device 500, and includes similar or the same components as the device 500. However, the device 900 is configured in such a way that the filter device 903 is coupled (e.g., mechanically coupled, structurally coupled) to the filter device 203 such that the front side of the filter device 903 faces a front side of the filter device 203. The filter device 903 is similar to the filter device 503, and thus includes similar or the same components as the filter device 503. The filter device 903 includes the substrate 530, the metal layer 534, the dielectric layer 536, the void 2520 and the sealing layer 540. The filter device 903 is coupled to the filter device 203 such that the sealing layer 540 is located over and coupled to the sealing layer 240.

The device 900 includes the plurality of pillar interconnects 250. The plurality of pillar interconnects 250 for the device 900 may be configured in a similar way as described for the device 500. However, the plurality of pillar interconnects 250 may extend through different layers and/or materials.

The device 900 includes a pillar interconnect 250a (e.g., first pillar interconnect) that extends through the filter device 903 and is configured to be electrically coupled to the filter device 203. In particular, the pillar interconnect 250a extends through the substrate 530, the dielectric layer 536, the sealing layer 540, the sealing layer 240 and the dielectric layer 136. The pillar interconnect 250a may be coupled to the interconnect 234a (of the metal layer 134). The pillar interconnect 250a may be configured to be electrically coupled to the at least one transducer 235 through at least the interconnect 234a. The pillar interconnect 250a may be laterally surrounded by the passivation layer 242.

The device 900 includes a pillar interconnect 250b (e.g., second pillar interconnect) that is configured to be coupled to the filter device 903. The pillar interconnect 250b may extend through the substrate 530. The pillar interconnect 250b may be coupled to the interconnect 534a (of the metal layer 534). The pillar interconnect 250b may be configured to be electrically coupled to the at least one transducer 535 through at least the interconnect 534a.

The device 900 includes a pillar interconnect 250c (e.g., third pillar interconnect) that extends through the filter device 903 and is configured to be electrically coupled to the filter device 203 and the filter device 903. In particular, the pillar interconnect 250a extends through the substrate 530, the dielectric layer 536, the sealing layer 540, the sealing layer 240 and the dielectric layer 136. The pillar interconnect 250c may be coupled to the interconnect 234b (of the metal layer 134) and the interconnect 534b (of the metal layer 534). The pillar interconnect 250c may be configured to be electrically coupled to ground, the filter device 203 and the filter device 903. The pillar interconnect 250c may be laterally surrounded by the passivation layer 242.

It is noted that the devices described in the disclosure may include a different number of pillar interconnects 250 that are coupled to the filter device(s). Thus, the devices described in the disclosure are not limited to three pillar interconnects 250. A device may include several pillar interconnects coupled to ground, several pillar interconnects configured to be electrically coupled to a first filter device, and/or several pillar interconnects configured to be electrically couple to a second filter device. Various sealing layers (e.g., 240, 540) are described in the disclosure. A sealing layer (e.g., seal layer) may be and/or may include a third layer, a top package layer, a bottom package layer, a front side package layer, a cavity reinforcement layer, a stabilization layer, an organic layer, a dielectric layer, a sheet layer, a polymer layer, a foil layer, an encapsulation layer and/or a stability layer. Examples of a sealing layer includes a photo resist layer (e.g., SU-8 photo resist), benzocyclobutene (BCB), an epoxy foil, and/or an adhesive foil (e.g., structurable adhesive foil) comprising inter dispersed particles like silicon dioxide ($SiO_2$).

Figure 10:
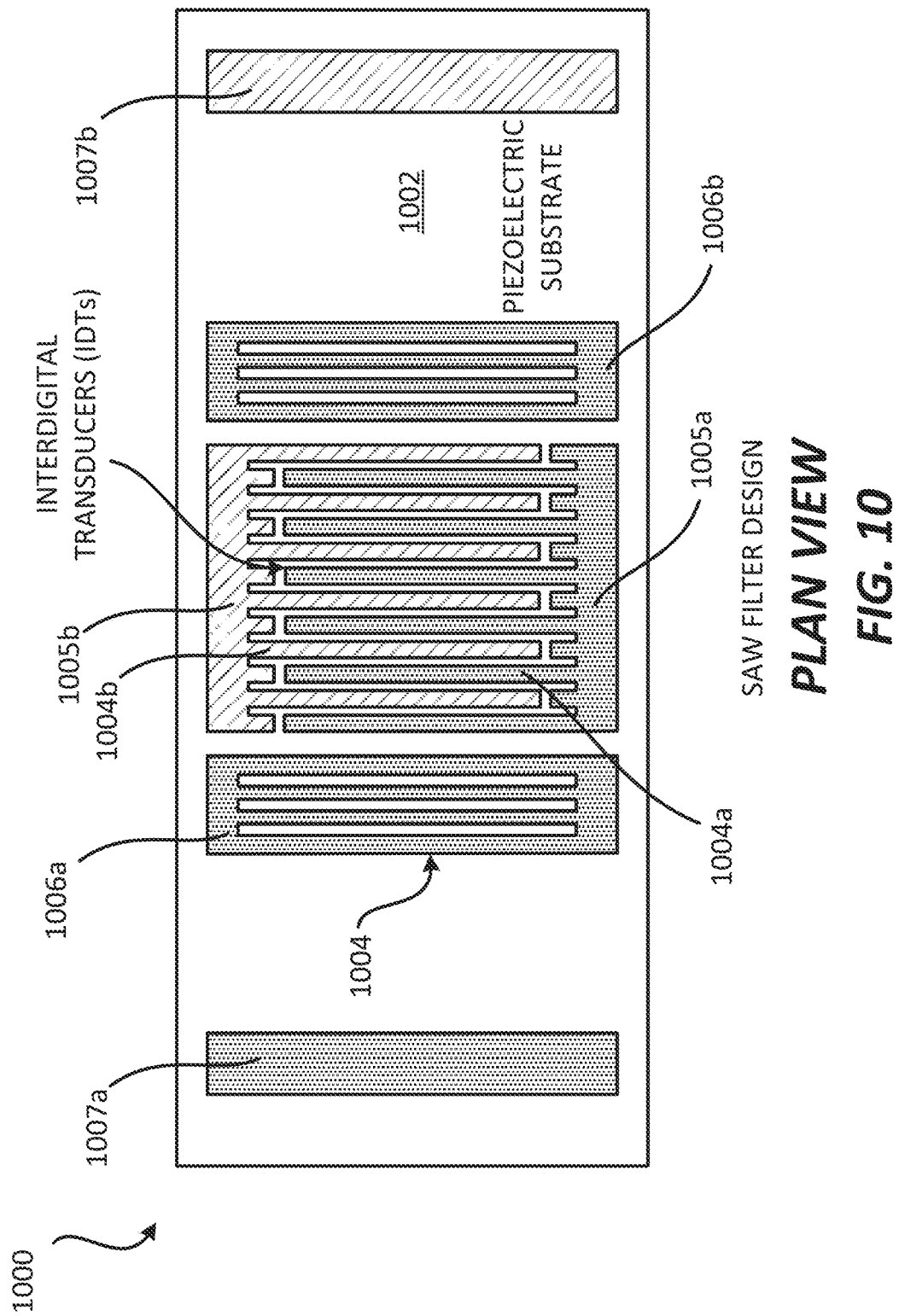
FIG. 10 illustrates a plan view of a metal layer of an integrated device configured to operate as a signal filter.

FIG. 10 illustrates a top plan view of a substrate 1002 and the metal layer 1004 of a filter device 1000. The filter device 1000 may represent any of the filter devices described in the disclosure. The substrate 1002 and the metal layer 1005 may be implemented in any of the filter devices described in the disclosure. As shown in FIG. 10, the metal layer 1004 is patterned in such a way that portions of the metal layer 1004 may be configured as transducers, electrodes and/or interconnects. For example, portions of the metal layer 1004 may be patterned and configured to operate as interdigital transducers 1004a-1004b. Other portions of the metal layer 1004 may be patterned and configured to operate as electrodes 1005a-1005b. Other portions of the metal layer 1004 may be patterned and configured to operate as reflectors 1006a-1006b. Other portions of the metal layer 1004 may be patterned and configured to operate as interconnects 1007a-1007b. It is noted that different implementations may have a metal layer 104 with different patterns and/or configurations. The metal layer 1004 may be formed on a first surface of the substrate 1002 or a second surface of the substrate 1002. For example, the metal layer 1004 may be formed on a top surface of the substrate 1002 or a bottom surface of the substrate 1002. In some implementations, metal layers may be formed over a first surface and a bottom surface of the substrate 1002. All of the components shown may be formed on one metal layer 1004. However, in some implementations, the metal layer 1004 may include two or more metal layers. Some of the components may be defined by a first metal layer and some of the components may be defined by a second metal layer. For example, a first metal layer may be used to define IDTs, and the second metal layer may be used to define interconnects and/or electrodes.

Figure 11:
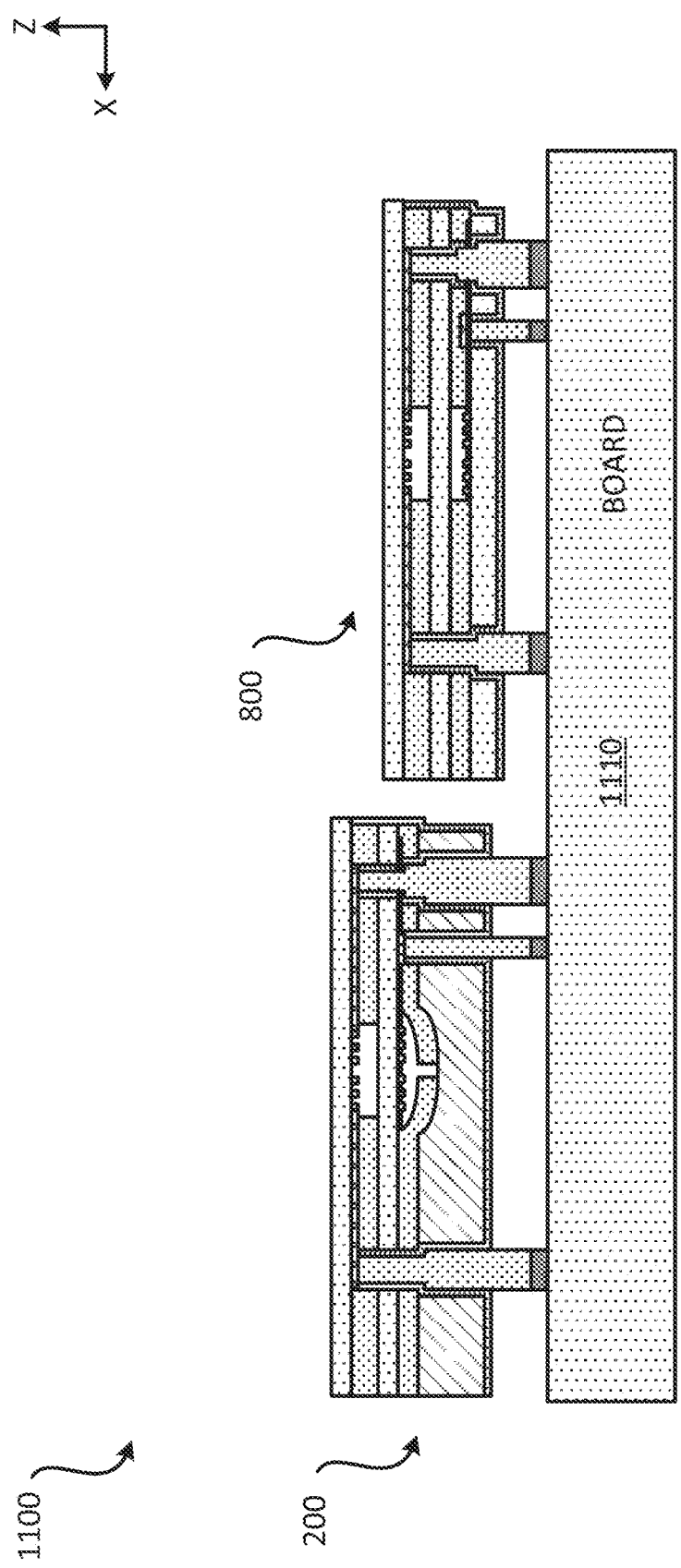
FIG. 11 illustrates a profile view of several package that each include multiple integrated devices configured as signal filters, coupled to a board.

FIG. 11 illustrates a package 1100 that includes a board 1110 and the device 200 and the device 800. The device 200 and the device 800 are coupled to the board 1110. The board 1110 may be a printed circuit board (PCB). Different implementations may couple different numbers of devices that include multiple filter devices, to the board 1110. In some implementations, any of the devices (e.g., 200, 300, 400, 500, 600, 800, 900) may be coupled to a board and/or a package substrate.

Figure 12:
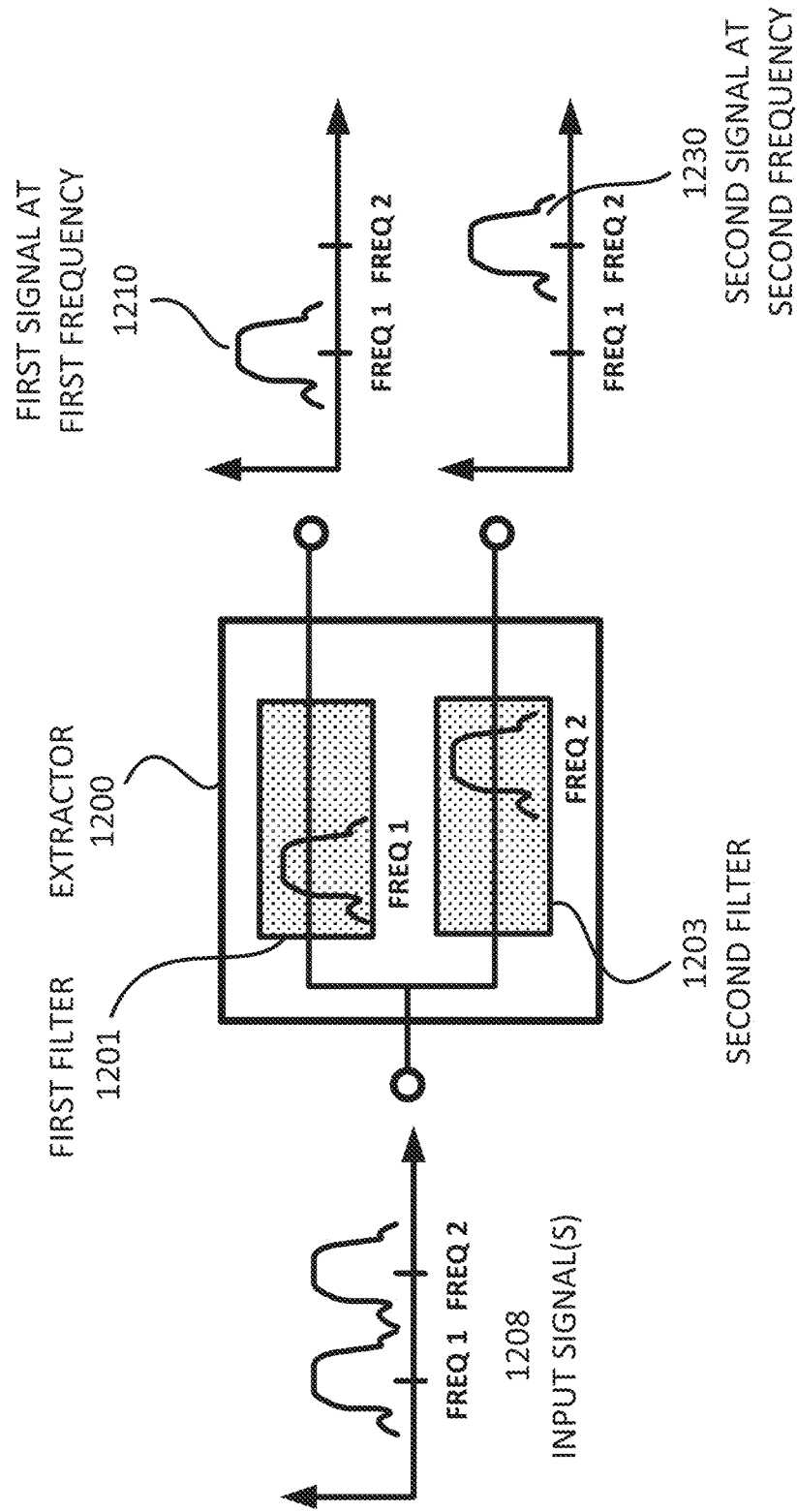
FIG. 12 conceptually illustrates multiple filters used to filter and extract signals at different frequencies.

FIG. 12 conceptually illustrates how several filters (e.g., signal filters) may be used to filter out unwanted signals and extract certain signals from at least one input signal. FIG. 12 conceptually illustrates an extractor 1200 that includes a first filter 1202 and a second filter 1203. The extractor 1200 may be implemented as the device (e.g., 200, 300, 400, 500, 600, 700, 800, 900). The first filter 1201 may be the filter device 201. The second filter 1203 may be the filter device 203. The extractor 1200 may receive at least one input signal 1208 that includes a first signal at a first frequency and a second signal at a second frequency. The first filter 1201 may receive the at least one input signal 1208 and filter unwanted signals at certain frequencies, while leaving or passing through the first signal 1210 at the first frequency. The second filter 1203 may receive the at least one input signal 1208 and filter unwanted signals at certain frequencies, while leaving or passing through the second signal 1230 at the second frequency. Thus, the extractor 1200 effectively extracts the first signal 1210 and the second signal 1230 from the input signal 1208. In some implementations, multiple extractors may be used to filter and extract several signals at different frequencies. In some implementations, the first filter 1201 may include a first IDT and the second filter may include a second IDT.

Exemplary Sequence For Fabricating a Filter Device

Figure 13A:
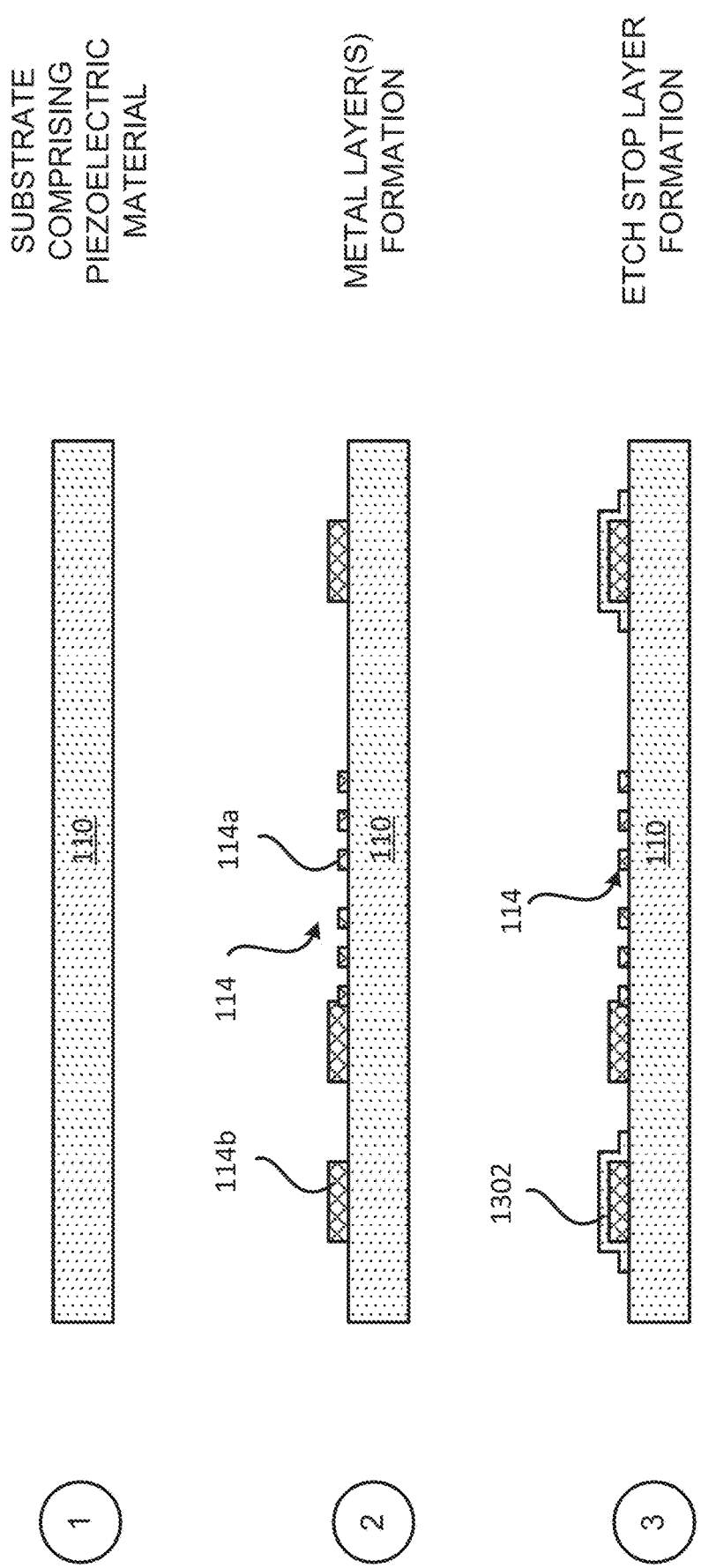
FIGS. 13A-13B illustrate an exemplary sequence for fabricating an integrated device configured to operate as a signal filter.
Figure 13B:
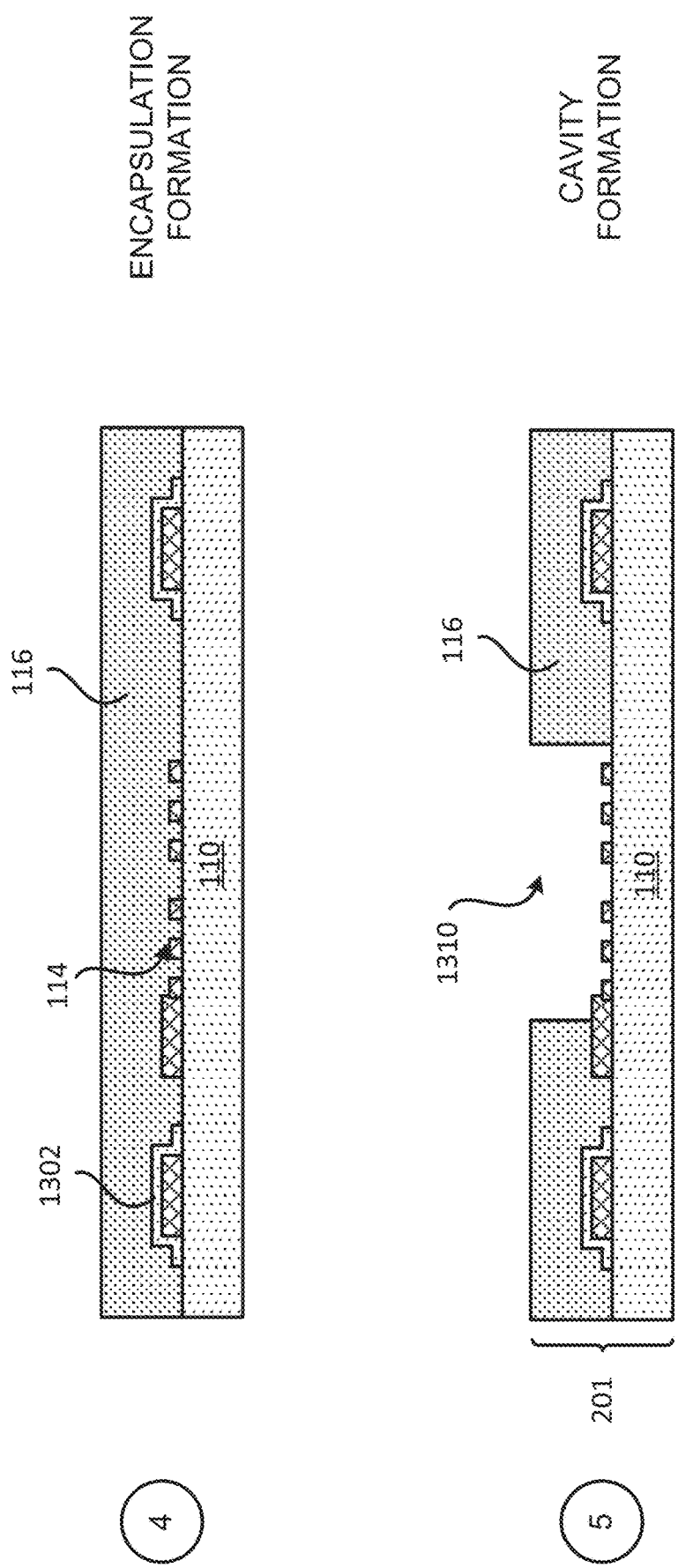

In some implementations, fabricating a filter includes several processes. FIGS. 13A-13B illustrate an exemplary sequence for providing or fabricating a filter device. In some implementations, the sequence of FIGS. 13A-13B may be used to provide or fabricate the filter device 201 of FIG. 2. However, the process of FIGS. 13A-13B may be used to fabricate any of the filter devices described in the disclosure. For example, the process of FIGS. 13A-13B may be used to fabricate the filter device 701.

It should be noted that the sequence of FIGS. 13A-13B may combine one or more stages in order to simplify and/or clarify the sequence for providing or fabricating a filter device. In some implementations, the order of the processes may be changed or modified. In some implementations, one or more of processes may be replaced or substituted without departing from the spirit of the disclosure.

Stage 1, as shown in FIG. 13A, illustrates a state after a substrate 110 is provided. The substrate 110 may be a piezoelectric substrate. The substrate 110 may include a piezoelectric material. In some implementations, the substrate 110 may include a piezoelectric layer that is formed and located over a first surface (e.g., top surface) of the substrate 110. For example, the substrate 110 may include glass with a piezoelectric layer formed and located over a first surface of the glass. Other materials may be used instead of glass. Different implementations may use different material may be used for the piezoelectric material (e.g., Aluminum Nitride (AlN). The entire substrate may be made of a piezoelectric material or only a portion of the substrate may include a piezoelectric material. Other substrates include the substrates 410 and 1002.

Stage 2 illustrates a state after a metal layer 114 is formed over the first surface of the substrate 110. The metal layer 114 may be a patterned metal layer. A patterning process and a plating process may be used to form the metal layer 114. The metal layer 114 may be formed over a piezoelectric layer. The metal layer 114 may be patterned to be configured as transducers (e.g. 215, 415), electrodes and/or interconnects. Different implementations may use different patterns and/or configurations for the metal layer 114. In some implementations, the metal layer 114 may include a first metal layer 114a and a second metal layer 114b. The first metal layer 114a may be thinner than the second metal layer 114b. In some implementations, the first metal layer 114a may be formed over the substrate 110 and then a second metal layer 114b may be formed over the substrate 110. The first metal layer 114a may be configured to operate as transducers, and the second metal layer 114b may be configured to operate as electrodes and/or interconnects.

Stage 3 illustrates a state after an etch stop layer 1302 is formed. A deposition process may be used to form the etch stop layer 1302 over portions of the metal layer 114.

Stage 4, as shown in FIG. 13B, illustrates a state after an encapsulation layer 116 is formed over a first surface of the substrate 110. A deposition process and/or a lamination process may be used to form the encapsulation layer 116. The encapsulation layer 116 may be formed over a piezoelectric layer of the substrate. The encapsulation layer 116 may include a mold, a resin and/or an epoxy. The encapsulation layer 116 may be means for encapsulation. A compression and transfer molding process, a sheet molding process, or a liquid molding process may be used to form the encapsulation layer 116. The encapsulation layer 116 may include a foil. The encapsulation layer 116 may be photo etchable.

Stage 5 illustrates a state after a cavity 1310 is formed in the encapsulation layer 116. A laser process (e.g., laser ablation), a lithography process (e.g., exposure and development), and/or an etching process may be used to form the cavity 1310. The cavity 1310 may be formed over a portion of the metal layer 114 that is patterned and/or configured to operate as a transducer. The cavity 1310 may become a void for a filter device. Stage 5 may illustrate an example of the filter device 201. The filter device 201 may be an integrated device (e.g., bare die).

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Sequence For Fabricating a Filter Device

Figure 14A:
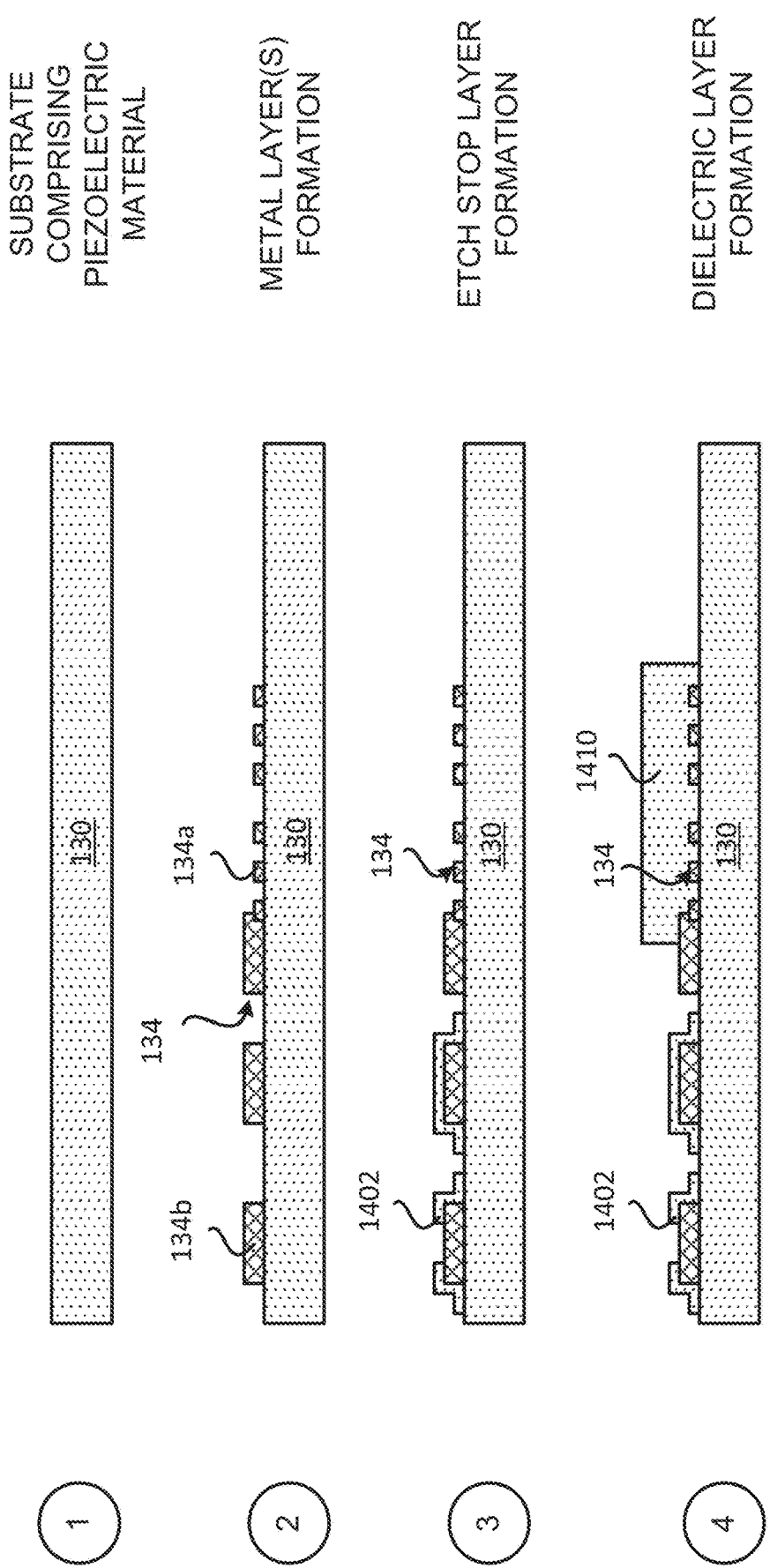
FIGS. 14A-14C illustrate another exemplary sequence for fabricating an integrated device configured to operate as a signal filter.
Figure 14B:
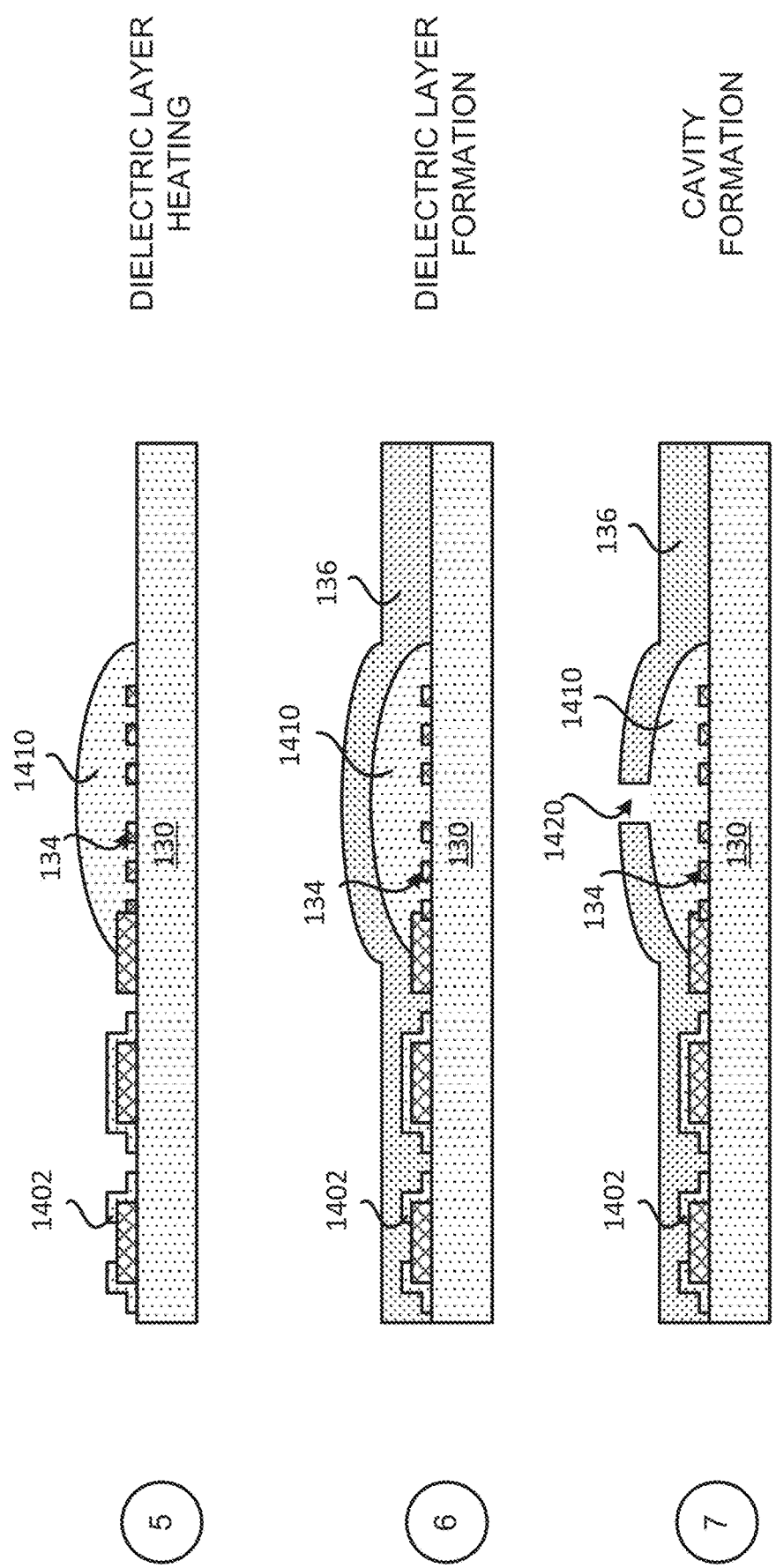

In some implementations, fabricating a filter includes several processes. FIGS. 14A-14B illustrate an exemplary sequence for providing or fabricating a filter device. In some implementations, the sequence of FIGS. 14A-14C may be used to provide or fabricate the filter device 203 of FIG. 2. However, the process of FIGS. 14A-14C may be used to fabricate any of the filter devices described in the disclosure. For example, the process of FIGS. 14A-14C may be used to fabricate the filter device 603.

Figure 14C:
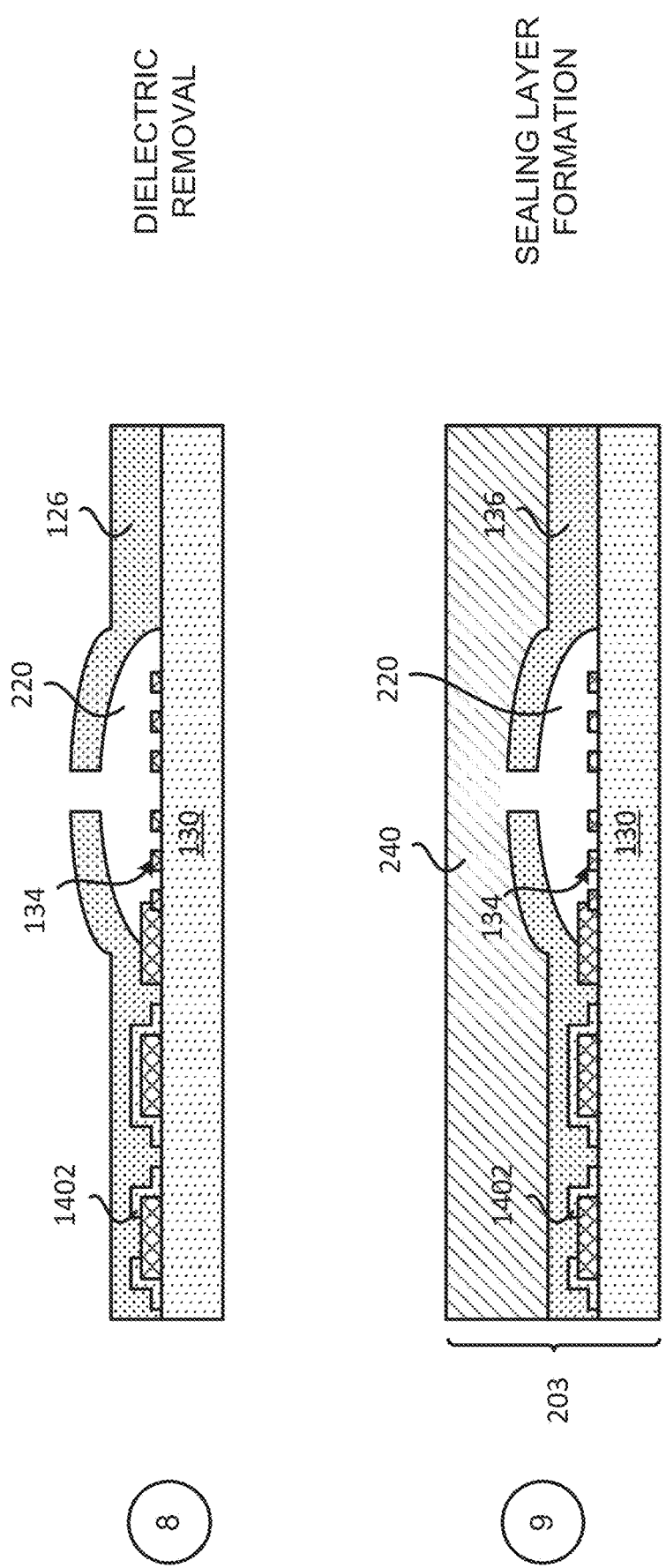

It should be noted that the sequence of FIGS. 14A-14C may combine one or more stages in order to simplify and/or clarify the sequence for providing or fabricating a filter device. In some implementations, the order of the processes may be changed or modified. In some implementations, one or more of processes may be replaced or substituted without departing from the spirit of the disclosure.

Stage 1, as shown in FIG. 14A, illustrates a state after a substrate 130 is provided. The substrate 130 may be a piezoelectric substrate. The substrate 130 may include a piezoelectric material. In some implementations, the substrate 130 may include a piezoelectric layer that is formed and located over a first surface (e.g., top surface) of the substrate 130. For example, the substrate 130 may include glass with a piezoelectric layer formed and located over a first surface of the glass. Other materials may be used instead of glass. Different implementations may use different material may be used for the piezoelectric material (e.g., Aluminum Nitride (AlN). The entire substrate may be made of a piezoelectric material or only a portion of the substrate may include a piezoelectric material. Other substrates include the substrates 530 and 1002.

Stage 2 illustrates a state after a metal layer 134 is formed over the first surface of the substrate 130. The metal layer 134 may be a patterned metal layer. A patterning process and a plating process may be used to form the metal layer 134. The metal layer 134 may be formed over a piezoelectric layer. The metal layer 134 may be patterned to be configured as transducers (e.g. 235, 435), electrodes and/or interconnects. Different implementations may use different patterns and/or configurations for the metal layer 134. In some implementations, the metal layer 134 may include a first metal layer 134a and a second metal layer 134b. The first metal layer 134a may be thinner than the second metal layer 134b. In some implementations, the first metal layer 134a may be formed over the substrate 130 and then a second metal layer 134b may be formed over the substrate 130. The first metal layer 134a may be configured to operate as transducers, and the second metal layer 134b may be configured to operate as electrodes and/or interconnects.

Stage 3 illustrates a state after an etch stop layer 1402 is formed. A deposition process may be used to form an etch stop layer 1402 over portions of the metal layer 134.

Stage 4 illustrates a state after a dielectric layer 1410 is formed over portions of the metal layer 134 that is configured to operate as a transducer. The dielectric layer 1410 may be deposited over the substrate 130 and the metal layer 134. A deposition process and/or a lamination process may be used to form the dielectric layer 1410.

Stage 5, as shown in FIG. 14B, illustrates a state after the dielectric layer 1410 has been heated, which causes the dielectric layer 1410 to have a dome shape or a droplet shape, over the portion of the metal layer 134 that is configured to operate as a transducer.

Stage 6, illustrates a state after a dielectric layer 136 is formed over the substrate 130, the dielectric layer 1410, the etch stop layer 1402 and the metal layer 134. A deposition process may be used to form the dielectric layer 136.

Stage 7 illustrates a state after a cavity 1420 (e.g., opening) is formed in the dielectric layer 136 over the dielectric layer 1410. An etching process may be used to form the cavity 1420.

Stage 8, as shown in FIG. 14C illustrates a state after the dielectric layer 1410 is removed, leaving a void 220 over a portion of the metal layer 134 that is configured to operate as a transducer. The void 220 may include the shape of a dome. The dielectric layer 1410 may be removed by dissolving the dielectric layer 1410.

Stage 9 illustrates a state after a sealing layer 240 is formed over the dielectric layer 136. The sealing layer 240 may include an organic layer. A deposition process may be used to form the sealing layer 240. The sealing layer 240 may serve as a planarization layer for the filter device. Stage 9 may illustrate the filter device 203. The filter device 203 may be an integrated device (e.g., bare die).

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Sequence For Fabricating a Device Comprising Stacked Filters

In some implementations, fabricating a device that includes stacked filters for signal filtering includes several processes. FIGS. 15A-15F illustrate an exemplary sequence for providing or fabricating a device that includes stacked filters. In some implementations, the sequence of FIGS. 15A-15F may be used to provide or fabricate the device 200 of FIG. 2. However, the process of FIGS. 15A-15F may be used to fabricate any of the devices that includes stacked filters described in the disclosure.

It should be noted that the sequence of FIGS. 15A-15F may combine one or more stages in order to simplify and/or clarify the sequence for providing or fabricating a device that includes stacked filters. In some implementations, the order of the processes may be changed or modified. In some implementations, one or more of processes may be replaced or substituted without departing from the spirit of the disclosure.

Figure 15A:
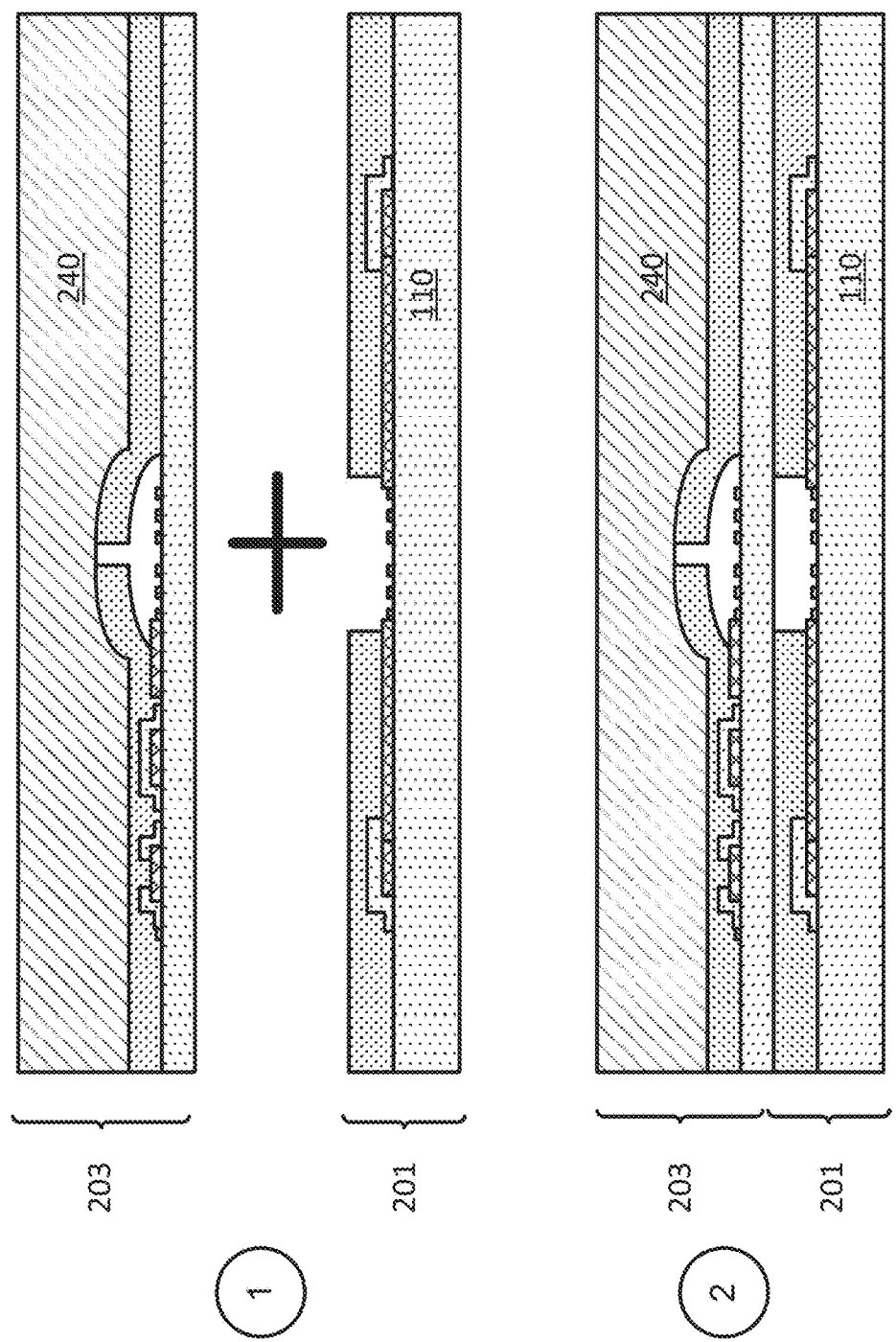
FIG. 15A-15F illustrate an exemplary sequence for fabricating a package that includes multiple integrated devices configured to operate as signal filters.

Stage 1, as shown in FIG. 15A, illustrates a state after a filter device 201 and a filter device 203 are provided. FIGS. 13A-13B and FIGS. 14A-14C illustrate exemplary sequences for fabricating and providing the filter device 201 and the filter device 203.

Stage 2 illustrates a state after the filter device 203 is coupled (e.g., mechanically coupled, structurally coupled) to the filter device 201. A thermal compression process may be used to bond the filter device 203 over the filter device 201. Stage 2 illustrates a front to back configuration of the filter devices. However, other implementations may include other configurations, such as a front to front configuration (e.g., face to face configuration).

Figure 15B:
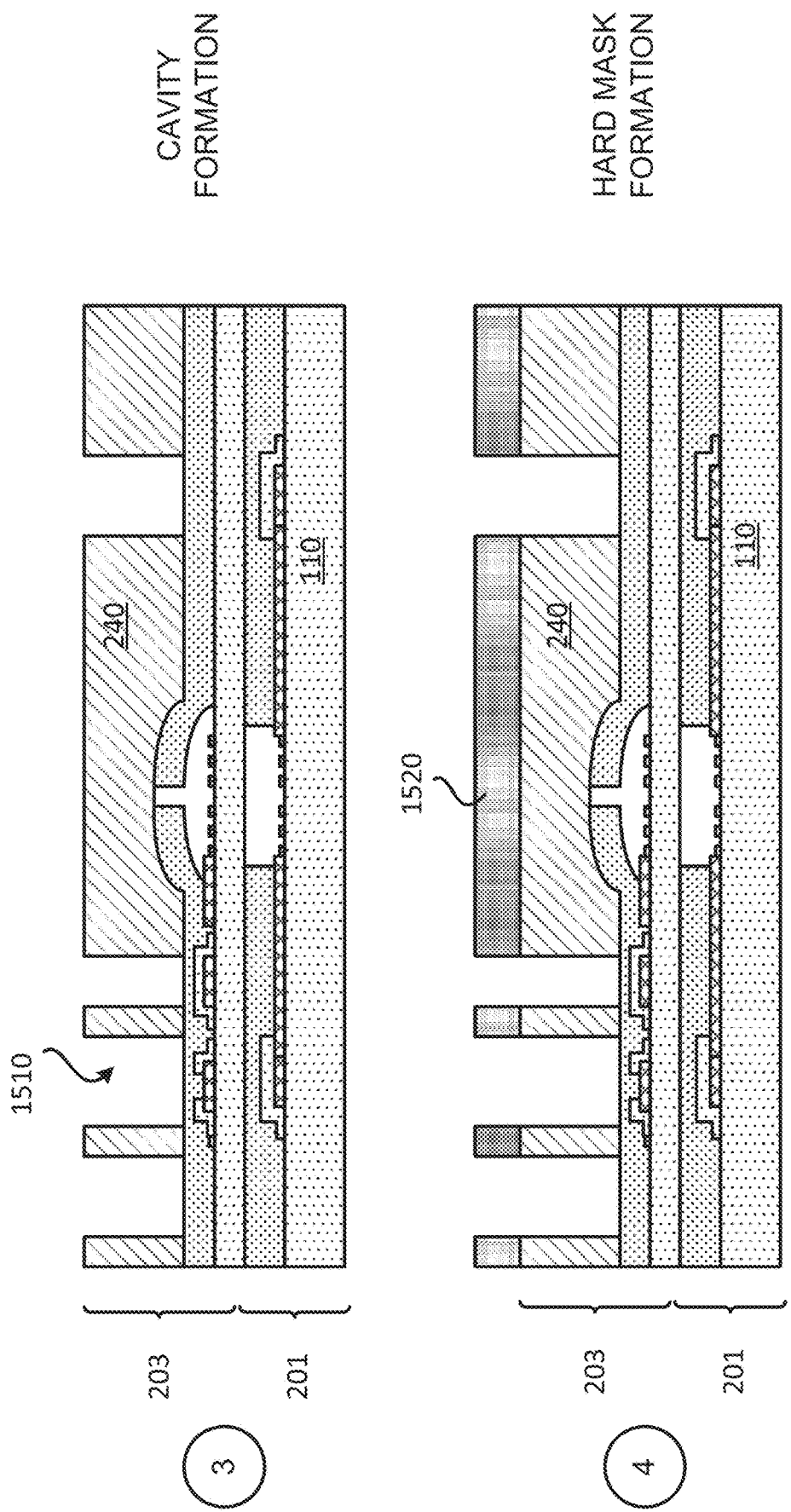

Stage 3, as shown in FIG. 15B, illustrates a state after at least one cavity 1510 is formed in the sealing layer 240 of the filter device 203. A laser process (e.g., laser ablation), a lithography process (e.g., exposure and development), or an etching process may be used to form the at least one cavity 1510.

Stage 4 illustrates a state after a hard mask 1520 is formed over the sealing layer 240. A deposition process may be used to provide the hard mask 1520.

Figure 15C:
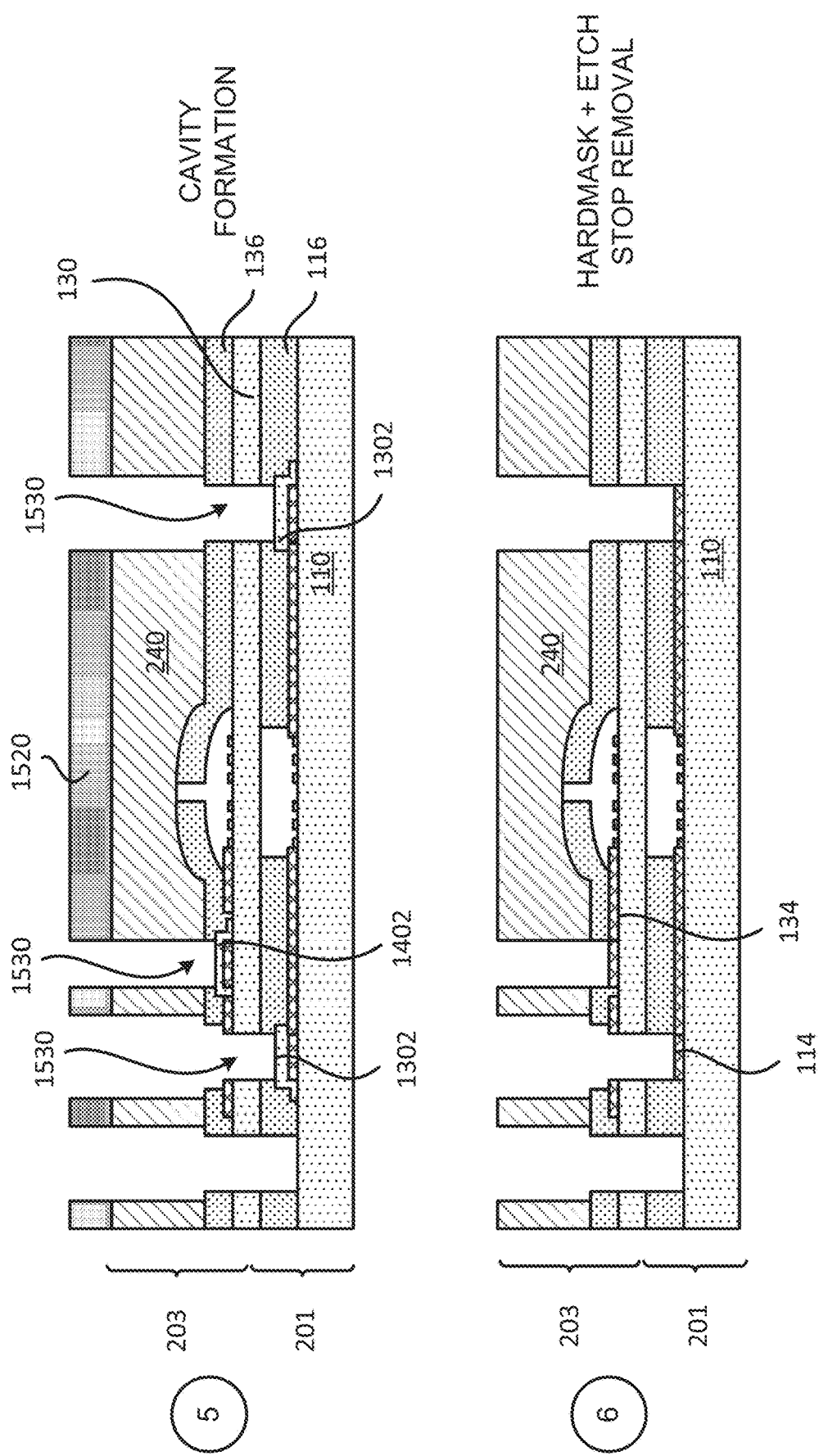

Stage 5, as shown in FIG. 15C, illustrates a state after cavities 1530 are formed in the dielectric layer 136, the substrate 130 and the encapsulation layer 116. The cavities may be formed until the etch stop layer 1302 and the etch stop layer 1402 are reached. Thus, the cavities 1530 may have different depths and may extend through different materials. A dry etching process may be used to form the cavities 1530.

Stage 6 illustrates a state after the hard mask 1520 and the etch stop layers 1302 and 1402 are removed. A wet etch may be used to remove the hard mask 1520 and the etch stop layers 1302 and 1402. Removing the etch stop layers 1302 and 1402 may expose portions of the metal layers 114 and 134.

Figure 15D:
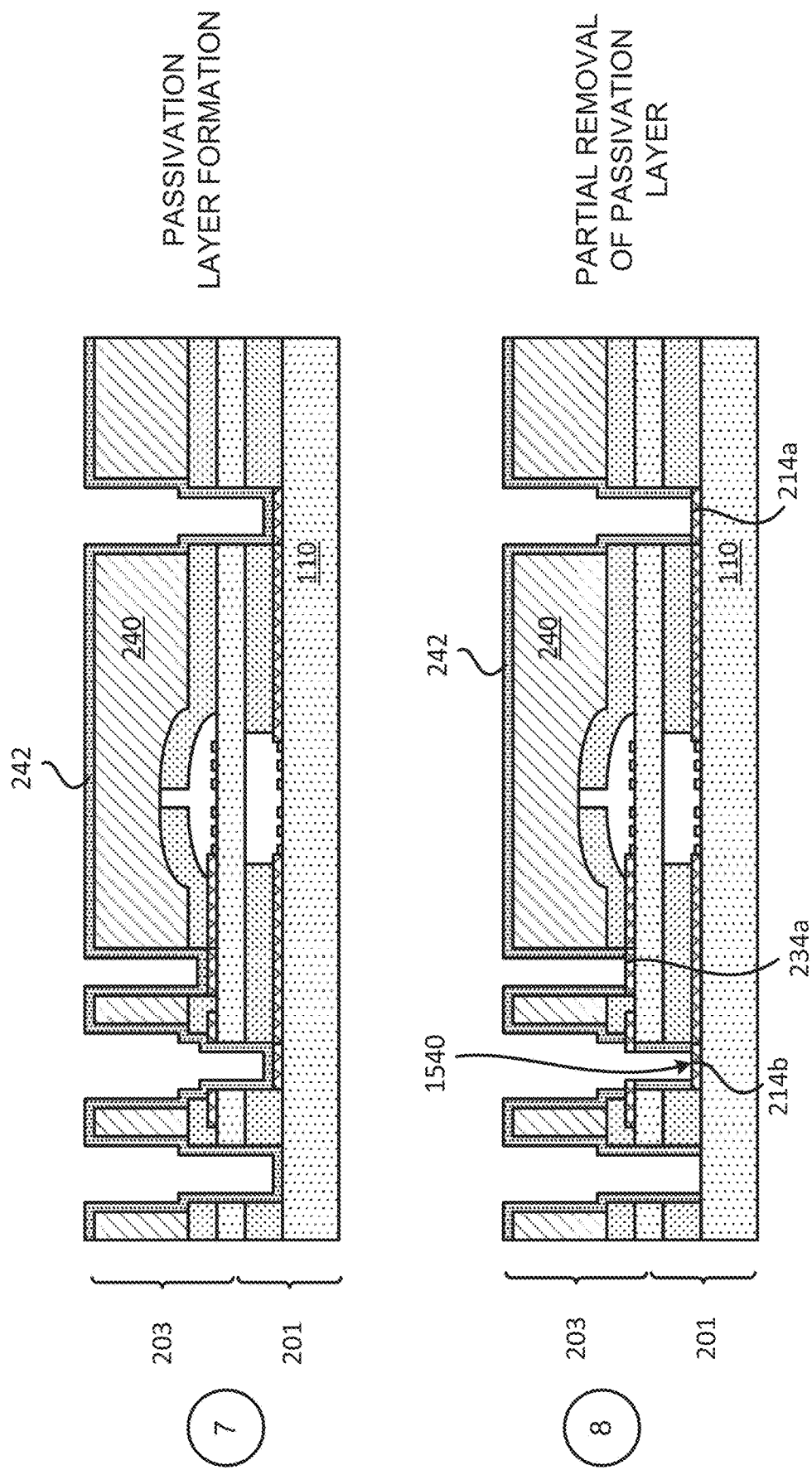

Stage 7, as shown in FIG. 15D, illustrates a state after a passivation layer 242 is formed over various portions, surfaces, side walls and/or cavities. A deposition process such as an evaporation process may be used to form the passivation layer 242.

Stage 8 illustrates a state after portions of the passivation layer 242 are removed. A laser process (e.g., laser ablation) may be used to remove portions of the passivation layer 242 located in the cavities and over a metal layer (e.g., 114, 134).

As shown at Stage 8, the passivation layer 242 located over the interconnects 214a, 214b and 234a, may be removed.

Figure 15E:
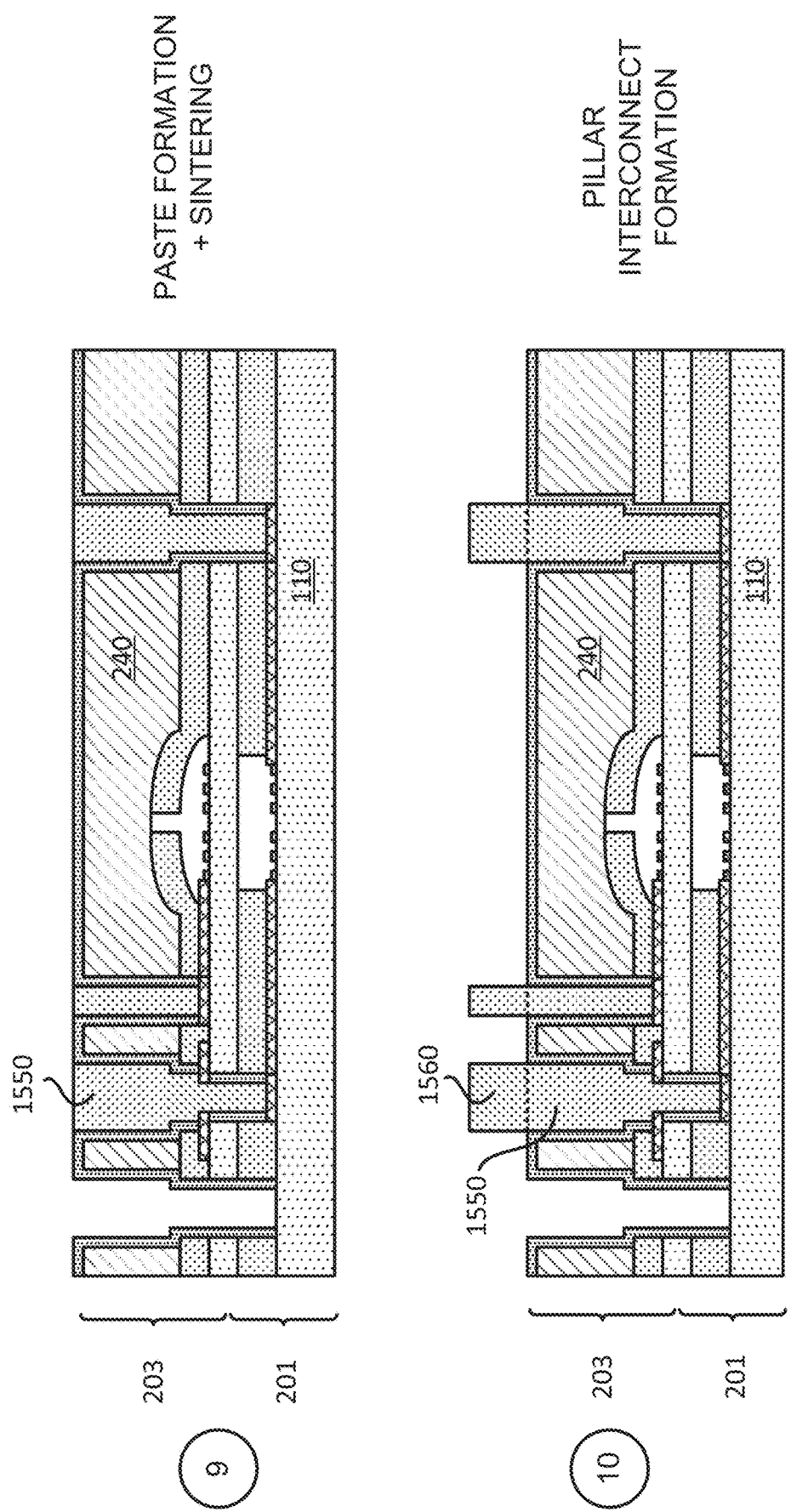

Stage 9, as shown in FIG. 15E, illustrates a state after portions of the pillar interconnects 1550 are formed in the cavities (e.g., 1510, 1530). An interconnect paste that includes electrically conductive material (e.g., copper) is provided in the cavities (e.g., through a stencil process) and the interconnect paste is heated (e.g., sintered) to form portions of the pillar interconnects 1550. Different implementations may provide the pillar interconnects differently.

Stage 10 illustrates after another portion of the pillar interconnects 1560 is formed over the pillar interconnects 1550. A plating process, a lithography process, a galvanization process may be used to form the pillar interconnects. The combination of the pillar interconnects 1550 and the pillar interconnects 1560 may form the plurality of pillar interconnects 250. The pillar interconnects 1550 and the pillar interconnects 1560 may be separate pillar interconnects or part of the same pillar interconnects.

Figure 15F:
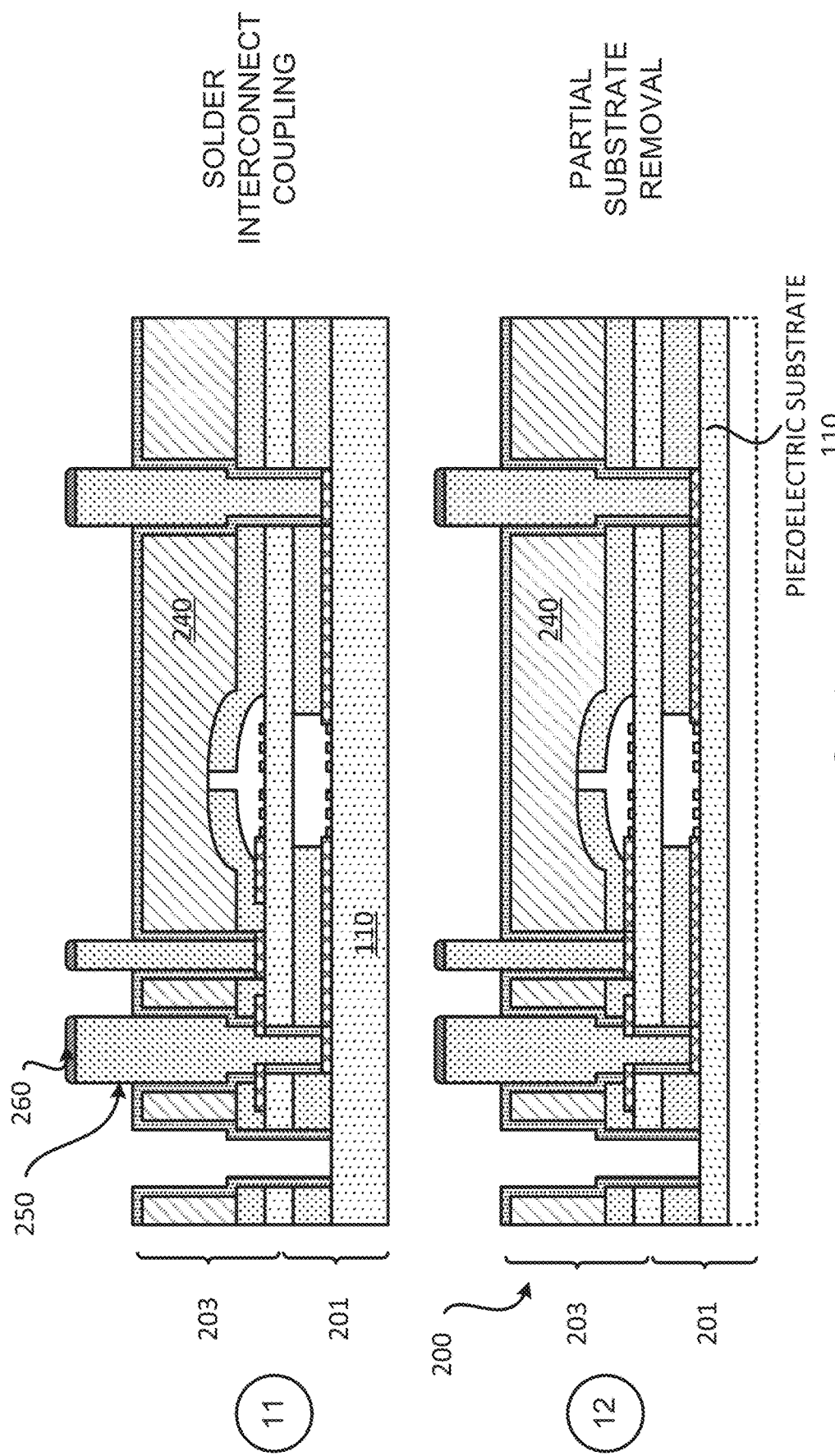

Stage 11, as shown in FIG. 15F, illustrates a state after the plurality of solder interconnects 260 is coupled to the plurality of pillar interconnects 250. A solder reflow process may be used to form and provide the plurality of solder interconnects 260.

Stage 12 illustrates a state after portions of the substrate 110 is removed. Portions of the substrate 110 may be removed through a backgrinding process and/or finishing process. Removing portions of the substrate 110 includes thinning the substrate 110. Stage 12 may include the device 200 that includes the filter device 201 and the filter device 203.

Figure 16:
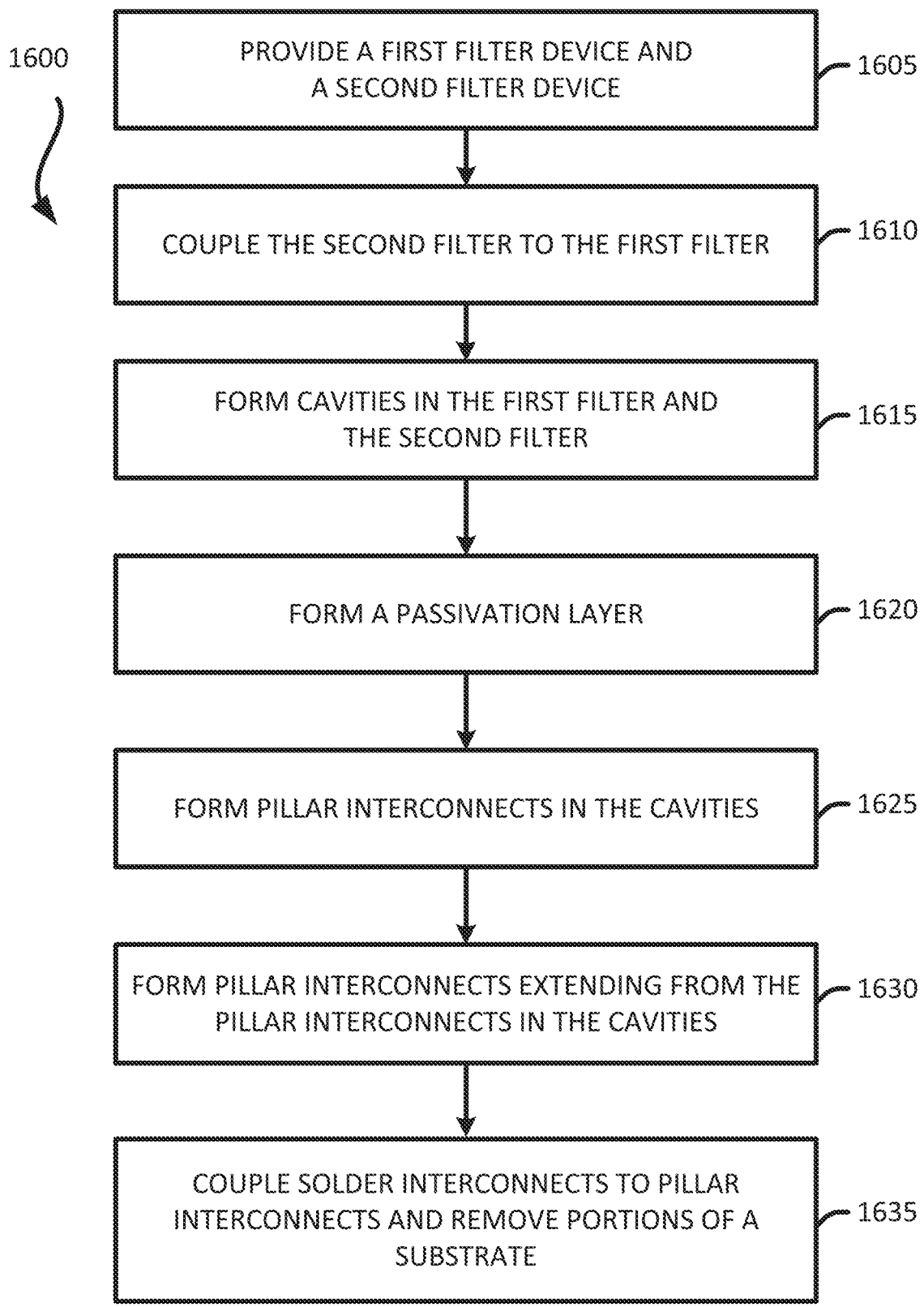
FIG. 16 illustrates an exemplary flow diagram of a method for fabricating a package that includes multiple integrated devices configured to operate as signal filters.

Exemplary Flow Diagram of a Method for Fabricating a Device Comprising Stacked Filters In some implementations, fabricating a device comprising stacked filters includes several processes. FIG. 16 illustrates an exemplary flow diagram of a method 1600 for providing or fabricating a device that includes stacked filters. In some implementations, the method 1600 of FIG. 16 may be used to provide or fabricate the device 200 of FIG. 2. However, the method 1600 may be used to fabricated any device comprising stacked filters.

It should be noted that the sequence of FIG. 16 may combine one or more processes in order to simplify and/or clarify the method for providing or fabricating a device that includes stacked filters. In some implementations, the order of the processes may be changed or modified.

The method provides (at 1605) first filter device (e.g., 201) and a second filter device (e.g., 203). Different implementations may provide different filter devices. Stage 1, as shown in FIG. 15A, illustrates an example of providing filters devices. FIGS. 13A-13B and FIGS. 14A-14C illustrate and describe exemplary sequences for fabricating and providing filter devices.

The method couples (at 1610) the second filter device to the first filter device. For example, the method may couple the filter device 203 to the filter device 201. A thermal compression process may be used to bond the filter device 203 to the filter device 201. Stage 2 of FIG. 15A illustrates and describes an example of two filter devices coupled to each other. The filter devices may be coupled in a front to back configuration or a front to front configuration (e.g., face to face configuration).

The method forms (at 1615) cavities in the filter devices. For example, the method may form cavities in various layers of the filter devices. A laser process and/or an etching process (e.g., dry etching, wet etching, photo etching) may be used to form the various cavities in the filter devices. Stages 3-6 of FIGS. 15-15C illustrate and describe example of cavities formation in the filter devices.

The method forms (at 1620) a passivation layer (e.g., 242) over surfaces, components, surfaces, side wall and/or layers of the filter devices. Forming a passivation layer may include removing portions of the passivation layer. A deposition process such as an evaporation process may be used to form the passivation layer. A laser process (e.g., laser ablation) may be used to remove portions of the passivation layer. Stages 7-8 of FIG. 15D illustrates examples passivation layer formation and removal.

The method forms (at 1625) pillar interconnects (e.g., 1550) in the cavities. A pasting process and a sintering process may be used to form the pillar interconnects in the cavities. An interconnect paste that includes electrically conductive material (e.g., copper) may be provided in the cavities (e.g., through a stencil process) and the interconnect paste is heated (e.g., sintered) to form portions of the pillar interconnects 1550. Different implementations may provide the pillar interconnects differently. Stage 9 of FIG. 15E illustrates an example of forming pillar interconnects in the cavities.

The method forms (at 1630) pillar interconnects extending from the pillar interconnects in the cavities. For example, the pillar interconnects 1560 may be formed over the pillar interconnects 1550. A plating process, a lithography process, a galvanization process may be used to form the pillar interconnects. The combination of the pillar interconnects 1550 and the pillar interconnects 1560 may form the plurality of pillar interconnects 250. Stage 10 of FIG. 15E illustrates an example of forming pillar interconnects that extend from pillar interconnects located in the cavities.

The method couples (at 1635) solder interconnects (e.g., 260) to the pillar interconnects (e.g., 250). A reflow process may be used to couple the solder interconnects to the pillar interconnects. Stage 11 of FIG. 15F illustrates an example of solder interconnects coupled to the pillar interconnects.

The method may remove (at 1635) portions of substrate of a filter device. For example, the method may thin a substrate 110 through a backgrinding process and a finishing process. Stage 12 of FIG. 15F illustrates an example of a substrate after portions of the substrate have been removed.

Exemplary Electronic Devices

Figure 17:
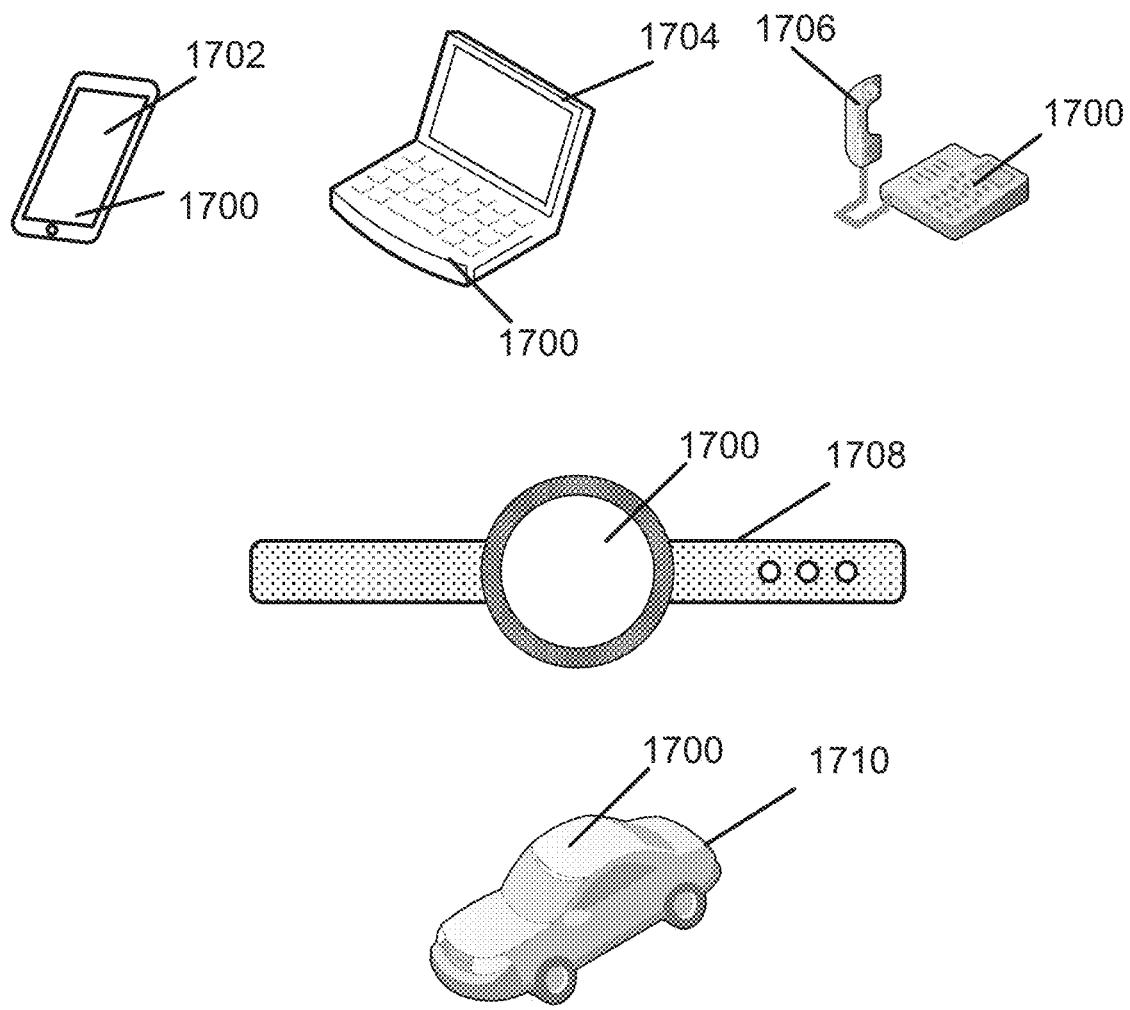
FIG. 17 illustrates various electronic devices that may integrate a die, an integrated device, an integrated passive device (IPD), a passive component, a package, and/or a device package described herein.

FIG. 17 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1702, a laptop computer device 1704, a fixed location terminal device 1706, a wearable device 1708, or automotive vehicle 1710 may include a device 1700 as described herein. The device 1700 may be, for example, any of the devices and/or integrated circuit (IC) packages described herein. The devices 1702, 1704, 1706 and 1708 and the vehicle 1710 illustrated in FIG. 17 are merely exemplary. Other electronic devices may also feature the device 1700 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-12, 13A-13B, 14A-14C, 15A-15F, and/or 16-17 may be rearranged and/or combined into a single component, process, feature or function or embodied in several components, processes, or functions. Additional elements, components, processes, and/or functions may also be added without departing from the disclosure. It should also be noted FIGS. 1-12, 13A-13B, 14A-14C, 15A-15F, and/or 16-17 and its corresponding description in the present disclosure is not limited to dies and/or ICs. In some implementations, FIGS. 1-12, 13A-13B, 14A-14C, 15A-15F, and/or 16-17 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. Electromagnetic coupling may mean that a signal from one circuit and/or component affects a signal of another circuit and/or component. Electromagnetic coupling may cause crosstalk. Electromagnetic coupling may be a form of signal coupling. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "top" and "bottom" are arbitrary. A component that is located on top may be located over a component that is located on a bottom. A top component may be considered a bottom component, and vice versa. The term "encapsulating" means that the object may partially encapsulate or completely encapsulate another object. The term "surrounding" means that an object(s) may partially surround or completely surround another object. The term "extends through" means that the object may partially extend or completely extend through another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect may include an electrically conductive material that may be configured to provide an electrical path for a signal (e.g., a data signal), ground and/or power. An interconnect may be part of a circuit. An interconnect may include more than one element or component. An interconnect may be defined by one or more interconnects. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package comprising:
   a first filter device comprising:
      a first substrate comprising a first piezoelectric material; and
      a first metal layer coupled to a first surface of the first substrate;
   a second filter device coupled to the first filter device, the second filter device comprising:
      a second substrate comprising a second piezoelectric material; and
      a second metal layer coupled to a first surface of the second substrate;
   a first encapsulation layer over at least a portion of the first substrate and under at least a portion of the second substrate;
      a first pillar interconnect configured to be electrically coupled to the first metal layer of the first filter device, wherein the first pillar interconnect extends through the second filter device and the first encapsulation layer;
      a second pillar interconnect configured to be electrically coupled to the second metal layer of the second filter device; and
      a third pillar interconnect configured to be electrically coupled to ground, the first filter device and the second filter device, wherein the third pillar interconnect extends through the second substrate of the second filter device.

2. The package of claim 1, wherein the first pillar interconnect extends through the second substrate of the second filter device.

3. The package of claim 1,
   wherein the second filter further comprises a second encapsulation layer, and
   wherein the third pillar interconnect further extends through the second encapsulation layer of the second filter device.

4. The package of claim 3, further comprising a passivation layer located between the second substrate and the third pillar interconnect.

5. The package of claim 1, wherein the first filter device includes a void, the void defined at least in part by an absence of the first encapsulation layer over a portion of the first substrate.

6. The package of claim 5, wherein the void includes a dome shaped void.

7. The package of claim 1, wherein a front side of the first filter device is coupled to a back side of the second filter device.

8. The package of claim 1, wherein a front side of the first filter device is coupled to a front side of the second filter device.

9. The package of claim 1, wherein the first filter device is configured to operate as a surface acoustic wave (SAW) filter or a bulk acoustic wave (BAW) filter.

10. The package of claim 1, further comprising a passivation layer located (i) between the first pillar interconnect and the first substrate, and (ii) between the second pillar interconnect and the second substrate.

11. The package of claim 1, wherein the first filter device includes the first encapsulation layer coupled to at least a portion of the first substrate.

12. The package of claim 1, wherein the first filter device comprises:
   a first dielectric layer coupled to the first substrate; and
   a sealing layer coupled to the first dielectric layer.

13. An apparatus comprising:
   means for first signal filtering comprising a first substrate;
   means for second signal filtering coupled to the means for first signal filtering, wherein the means for second signal filtering comprises a second substrate;
   a first encapsulation layer over at least a portion of the means for first signal filtering and under at least a portion of the means for second signal filtering;
   means for first pillar interconnection configured to be electrically coupled to the means for first signal filtering, wherein the means for first pillar interconnection extends through the means for second signal filtering wherein the first pillar interconnect extends through the second filter device and the first encapsulation layer;
   means for second pillar interconnection configured to be electrically coupled to the means for second signal filtering; and
   a passivation layer located (i) between the means for first pillar interconnection and the first substrate, and (ii) between the means for second pillar interconnection and the second substrate.

14. The apparatus of claim 13, further comprising means for third pillar interconnection configured to be electrically coupled to ground, the means for first signal filtering and the means for second signal filtering, wherein the means for third pillar interconnection extends through the means for second signal filtering.

15. The apparatus of claim 13, wherein a front side of the means for first signal filtering is coupled to a back side of the means for second signal filtering.

16. The apparatus of claim 13, wherein a front side of the means for first signal filtering is coupled to a front side of the means for second signal filtering.

17. The apparatus of claim 13, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

18. A method for fabricating a package, comprising:
   providing a first filter device comprising:
      a first substrate comprising a first piezoelectric material; and
      a first metal layer coupled to a first surface of the first substrate;
   coupling a second filter device to the first filter device, the second filter device comprising:
      a second substrate comprising a second piezoelectric material; and
      a second metal layer coupled to a first surface of the second substrate;
   providing a first encapsulation layer over at least a portion of the first substrate and under at least a portion of the second substrate;
      forming a first pillar interconnect configured to be electrically coupled to the first metal layer of the first filter device, wherein the first pillar interconnect extends through the second filter device and the first encapsulation layer;

forming a second pillar interconnect configured to be electrically coupled to the second metal layer of the second filter device; and forming a third pillar interconnect configured to be electrically coupled to ground, the first filter device and the second filter device, wherein the third pillar interconnect extends through the second substrate of the second filter device.

19. The method of claim 18, wherein the first pillar interconnect extends through the second substrate of the second filter device.

20. The method of claim 18, further comprising forming a passivation layer located (i) between the first pillar interconnect and the first substrate, and (ii) between the second pillar interconnect and the second substrate, wherein the second filter further comprises a second encapsulation layer, and wherein the third pillar interconnect further extends through the second encapsulation layer of the second filter device.

\* \* \* \* \*